United States Patent
Wu et al.

(10) Patent No.: US 10,381,583 B2
(45) Date of Patent: Aug. 13, 2019

(54) ELECTRONIC DEVICE

(71) Applicant: Xerox Corporation, Norwalk, CT (US)

(72) Inventors: Yiliang Wu, Oakville (CA); Chad Smithson, Toronto (CA); Shiping Zhu, Dundas (CA)

(73) Assignee: XEROX CORPORATION, Norwalk, CT (US)

( * ) Notice: Subject to any disclaimer, the term of this patent is extended or adjusted under 35 U.S.C. 154(b) by 202 days.

(21) Appl. No.: 14/098,330

(22) Filed: Dec. 5, 2013

(65) Prior Publication Data
US 2015/0162555 A1 Jun. 11, 2015

(51) Int. Cl.
| | | |
|---|---|---|
| *H01L 29/08* | (2006.01) | |
| *H01L 51/05* | (2006.01) | |
| *H01L 51/42* | (2006.01) | |
| *G11C 13/04* | (2006.01) | |
| *G11C 13/00* | (2006.01) | |
| *H01L 51/00* | (2006.01) | |
| *H01L 27/28* | (2006.01) | |

(52) U.S. Cl.
CPC ...... *H01L 51/0508* (2013.01); *G11C 13/0014* (2013.01); *G11C 13/0016* (2013.01); *G11C 13/04* (2013.01); *G11C 13/047* (2013.01); *H01L 51/0566* (2013.01); *H01L 51/428* (2013.01); *G11C 2213/53* (2013.01); *H01L 27/283* (2013.01); *H01L 51/004* (2013.01); *H01L 51/0074* (2013.01); *Y02E 10/549* (2013.01)

(58) Field of Classification Search
CPC ............ H01L 51/0508; H01L 51/428; H01L 51/0566; H01L 51/004; G11C 13/0014; G11C 13/0016

See application file for complete search history.

(56) References Cited

U.S. PATENT DOCUMENTS

| | | | |
|---|---|---|---|
| 5,173,381 A | 12/1992 | Natansohn et al. | |
| 5,384,378 A | 1/1995 | Etzbach et al. | |
| 7,459,721 B2* | 12/2008 | Nakamura | H01L 51/0012 257/347 |
| 8,963,131 B2* | 2/2015 | Wu | H01L 51/0012 257/40 |
| 2005/0038143 A1* | 2/2005 | Yitzchaik | B82Y 10/00 524/99 |
| 2010/0227956 A1* | 9/2010 | Brown | C07F 7/0809 524/84 |
| 2014/0263945 A1* | 9/2014 | Huang | H01L 51/428 250/200 |

(Continued)

OTHER PUBLICATIONS

Ishiguro et al. "Optical switching of carrier transport in polymeric transistors with photochromic spiropyran molecules" in Journal of Materials Chemistry C, vol. 1, pp. 3012-3016. Published by the Royal Society of Chemistry in 2013.*

(Continued)

*Primary Examiner* — Tuan A Hoang
(74) *Attorney, Agent, or Firm* — Fay Sharpe LLP

(57) ABSTRACT

An electronic device includes a substrate, a gate electrode, a dielectric layer, a source electrode, a drain electrode, and a semiconducting layer formed from an organic semiconductor compound and a photo-responsive polymer. The resistance can be switched to a "low" state by irradiation, and can be switched to a "high" state by applying a gate bias voltage. This can be useful for a memory device.

22 Claims, 20 Drawing Sheets

(56) References Cited

U.S. PATENT DOCUMENTS

2015/0243916 A1* 8/2015 Jurchescu .......... H01L 51/0003 438/82

OTHER PUBLICATIONS

Lim et al. "Conductivity switching and electronic memory effect in Polymers with pendant Azobenzene chromophores" in Applied Materials & Interface vol. 1, pp. 60-71. Published by American Chemical Society in 2008.*

Minemawari et al. "Inkjet printing of single-crystal films" in Nature vol. 475, pp. 364-367. Published by Macmillan Publishers Limited in 2011.*

Ebata et al. "Highly soluble [1]Benzothieno[3,2-b]benzothiophene (BTBT) derivatives for high-performance, solution-processed organic field-effect transistors" in Journal of American Chemical Society vol. 129, pp. 15732-15733. Published by American Chemical Society in 2007.*

McCulloch et al. "Polytriarylamine semiconductors" in Material Matters vol. 4.3, p. 70. Published by Sigma-Aldrich in 2009.*

Brown et al. "Azo Polymers for reversible optical storage. 5. Orientation and dipolar interactons of azobenzene side groups in copolymers and blends containing methyl methacrylate structural units" in Macromolecules vol. 28, pp. 6116-6123. Published by American Chemical Society in 1995.*

Ishiguro et al. ("Optical switching of carrier transport in polymeric transistors with photochromic spiropyran molecules" in Journal of Materials Chemistry C vol. 1, pp. 3012-3016. Published by RSC Publishing in 2013).*

Andersson et al. ("Switchable charge traps in polymer diodes" in Advanced Materials vol. 17, pp. 1798-1803. Published by Wiley-VCH Verlag GmbH & Co. in 2005).*

McCulloch et al. ("Polytriarylamine Semiconductors" in Material Matters 2009, 4.3, p. 70. Published by Sigma-Aldrich in 2009).*

Brown et al. (Macromolecules vol. 28, pp. 6116-6123. Published by American Chemical Society in 1995).*

Lim et al. ("Conductivity switching and electronic memory effect in polymers with pendant azobenzene chromophores" in Applied Materials & Interfaces vol. 1, pp. 60-71. Published by American Chemical Society in 2009).*

Ebata et al. (Journal of American Chemical Society vol. 129, pp. 15732-15733. Published by American Chemical Society in 2007).*

Ishiguro et al. ("Optical switching of carrier transport in polymeric transistors with photochromic spiropyran molecules" in Journal of Materials Chemistry C vol. 1, pp. 3012-3016. Published by the Royal Society of Chemistry in 2013) (Year: 2013).*

Lim et al. ("Conductivity switching and electronic memory effect in polymers with pendant azobenzene chromophores" in Applied Materials & Interfaces vol. 1, pp. 60-71. Published by American Chemical Society in 2009) (Year: 2009).*

Brown et al. ("Azo polymers for reversible optical Storage 5" in Macromolecules vol. 28, pp. 6116-6123. Published by American Chemical Society in 1995) (Year: 1995).*

Ishiguro et al., "Optical switching of carrier transport in polymeric transistors with photochromic spiropyran molecules," J. Mater. Chem. C, 2013, 1, pp. 3012-3016.

* cited by examiner

ELECTRONIC DEVICE

BACKGROUND

The present disclosure relates to semiconductor memory, memory devices incorporating such memory, and electronic devices incorporating such memory. Generally, the memory devices of the present disclosure comprise a semiconducting layer. The semiconducting layer is formed from an organic semiconductor (i.e. a compound or a polymer) and a photo-responsive material (i.e. a compound or a polymer). The resulting memory device has a good retention, access time, write/erase speed, and power consumption.

Electronic memory devices are generally implemented as a semiconductor-based integrated circuit. Semiconductor memory has the property of random access, which means that it takes the same amount of time to access any memory location, so data can be efficiently accessed in any random order. Semiconductor memory also has much faster access times than other types of data storage; a byte of data can usually be written to or read from semiconductor memory within a few nanoseconds.

In a semiconductor memory device, data is stored in a circuit called a memory cell that consists of one to several transistors. Each transistor is generally composed of, on a substrate, an electrically conductive gate electrode, source and drain electrodes, an electrically insulating gate dielectric layer which separate the gate electrode from the source and drain electrodes, and a semiconducting layer which is in contact with the gate dielectric layer and bridges the source and drain electrodes.

Memory may be classified as volatile or nonvolatile. Volatile memory, such as DRAM, loses its stored data when the power to the memory chip is turned off. Nonvolatile memory (e.g. flash memory) preserves the data stored in it during periods Volatile DRAM has a short retention cycle; the industry standard requires refreshing every 64 milliseconds, i.e. more than 10 times per second. This results in high power and overhead requirements. Flash memory can have a cycle life of up to 10,000 write/erase cycles, has a relatively slower write/erase speed compared to DRAM, and requires high voltages (greater than 15 V) to operate, but has good retention of 10 years or more of the data written therein. As the density of flash memory increases, reliability problems arise due to crosstalk and the limited life cycle.

Some drawbacks of silicon-based electronics include their rigidity and the need of high temperatures for fabrication. These properties impede the use of such devices on flexible substrates such as plastics, cloths, and paper.

It would be desirable to develop a memory device that uses nonvolatile memory with a faster write/erase speed and longer cycle life than flash memory, and with a longer retention cycle than DRAM. Such devices would have several applications in conventional microelectronics. In addition, providing such devices in flexible and printable formats would be useful in low-cost non-silicon electronic devices as well. Longer data retention time should also reduce power consumption.

BRIEF DESCRIPTION

The present application discloses, in various embodiments, memory devices that provide high density nonvolatile memory for data processing and storage. The memory devices can be made on a flexible substrate, and include a semiconducting layer. The semiconducting layer can comprise an organic semiconductor (compound or polymer) and a photo-responsive polymer. Alternatively, the semiconducting layer can comprise an organic semiconductor (compound or polymer) and a photo-responsive compound that is not a spiropyran. Finally, the semiconducting layer can comprise an organic semiconductor (compound or polymer), a photo-responsive compound that is not a spiropyran, and a non-photo-responsive polymer.

Disclosed in various embodiments herein are electronic devices, comprising: a substrate; a first electrode and a second electrode contacting a semiconducting layer, wherein the semiconducting layer comprises an organic semiconductor and a photo-responsive polymer; and a dielectric layer separating a third electrode from the semiconducting layer, the first electrode, and the second electrode.

The organic semiconductor can be a compound or a semiconducting polymer.

In some embodiments, the organic semiconductor is a compound having the structure of Formula (I) as described herein. In more specific embodiments, the organic semiconductor can have the structure of Formulas (II), (III), (IV), (V), or (VI) as described herein, which fall within Formula (I).

In some embodiments, the organic semiconductor is a compound having the structure of Formula (VII) as described herein. In more specific embodiments, the organic semiconductor can have the structure of Formulas (VIII) or (IX) as described herein, which fall within Formula (VII).

The photo-responsive polymer can comprise a photo-responsive moiety selected from the group consisting of an azobenzene group, a spiropyran group, a coumarin group, a cinnamate group, a dithiazolylarylene group, a diarylethene group, a stilbene group, and an aromatic Schiff base group.

In particular embodiments, the photo-responsive moiety has the structure of Formula (A) as described herein. In more specific embodiments, the photo-responsive polymer includes a monomer of Formula (G) as described herein.

The photo-responsive polymer can be a copolymer. The monomer of Formula (G) may be from about 1 mole % to about 50 mole % of the copolymer. In more specific embodiments, the photo-responsive polymer has the structure of Formula (a), as described further herein. The weight ratio of the organic semiconductor to the photo-responsive polymer can be from about 25:75 to about 95:5. In specific embodiments, the organic semiconductor has a band gap of from about 1.2 to about 3.5 eV.

The electronic device can be a memory device that further comprises a light source adapted to illuminate the semiconducting layer. In specific constructions, the substrate is transparent and the light source illuminates the semiconducting layer through the substrate.

The difference between the HOMO level of the organic semiconductor and the HOMO level of the photo-responsive polymer is not greater than 0.5 eV in some specific embodiments.

Also disclosed in embodiments herein are electronic devices, comprising: a substrate; a first electrode and a second electrode contacting a semiconducting layer, wherein the semiconducting layer comprises an organic semiconductor and a photo-responsive compound that is not a spiropyran compound; and a dielectric layer separating a third electrode from the semiconducting layer, the first electrode, and the second electrode.

The organic semiconductor is sometimes a semiconducting polymer. Other times, the organic semiconductor is a compound, and the semiconducting layer further comprises a non-photo-responsive polymer.

The difference between the HOMO level of the organic semiconductor and the HOMO level of the photo-responsive compound is usually not greater than 0.5 eV.

Also disclosed herein are methods of using a memory device, wherein the memory device comprises: (i) a substrate; (ii) a first electrode and a second electrode contacting a semiconducting layer, wherein the semiconducting layer comprises (A) an organic semiconductor and (B) either (a) a photo-responsive polymer or (b) a photo-responsive compound that is not a spiropyran compound; and (iii) a dielectric layer separating a third electrode from the semiconducting layer and the first and the second electrodes. The methods comprise the steps of: illuminating the semiconducting layer with a light source to increase the current and switch the device from a first state to a second state; and changing a gate bias from a first value to a second value and then back to the first value to switch the device from the second state back to the first state, wherein the second value has a greater absolute magnitude than the first value.

The memory device can be operated at a voltage between the first electrode and the second electrode from about −5V to about −60V, and the first value of the third electrode bias is from about 0V to about −5 V.

In some methods, the light source is an ultraviolet light having a λmax of 400 nanometers to 190 nanometers.

Also disclosed in embodiments herein are semiconductor compositions, comprising an organic semiconductor (compound or polymer) and a photo-responsive material (compound or polymer), wherein the photo-responsive material is not a spiropyran compound.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
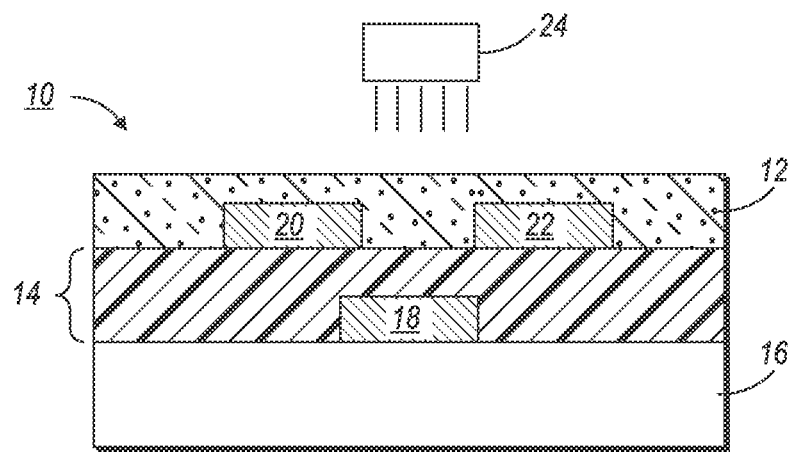
FIG. 1 is a diagram of a first embodiment of a TFT according to the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range of "from about 2 to about 10" also discloses the range "from 2 to 10."

The term "comprising" is used herein as requiring the presence of the named component and allowing the presence of other components. The term "comprising" should be construed to include the term "consisting of", which allows the presence of only the named component, along with any impurities that might result from the manufacture of the named component.

The present disclosure refers to a "polymer" and a "compound". A polymer is a large molecule composed of multiple repeating units chained together. One characteristic of a polymer is that different molecules of a polymer will have different lengths, and a polymer is described as having a molecular weight that is based on the average value of the chains (e.g. weight average or number average molecular weight). For a compound, all molecules will have the same molecular weight. Compared to a polymer, a compound is a small molecule. It is noted that the art sometimes attempts to distinguish between an "oligomer" and a "polymer", with an oligomer having only a few repeating units. For purposes of this disclosure, the term "polymer" should be considered as including oligomers.

The present disclosure relates to an electronic device that has a semiconducting layer, a dielectric layer, and three electrodes (gate, source, drain). This electronic device can be used as a memory device. The semiconducting layer of the electronic device can have one of two different constructions. In one construction, the semiconducting layer comprises an organic semiconductor and a photo-responsive polymer. In the other construction, the semiconducting layer comprises an organic semiconductor and a photo-responsive compound that is not a spiropyran, and sometimes contains a non-photo-responsive polymer binder. The organic semiconductor, in both constructions, can be a compound or a polymer.

The memory device is similar to the configuration of a thin-film transistor (TFT), but behaves differently. The memory device has three terminals (i.e. the electrodes). The current or resistance between the source and drain electrodes can be "read". The current/resistance can be switched to a "low" state by irradiating the semiconducting layer with a light source. The current/resistance can be switched to a "high" state by changing a gate bias voltage, then returning the gate bias voltage to its original magnitude. A high on/off ratio and very reproducible read/erase states can be obtained using this construction. This memory device can be in the form of a thin-film transistor configuration that is used in the memory cell of a memory chip. This can provide optical switching.

FIG. 1 illustrates a bottom-gate bottom-contact configuration for a memory device of the present disclosure. The device 10 comprises a substrate 16 in contact with the gate electrode 18 and a gate dielectric layer 14. The gate electrode 18 is depicted here atop the substrate 16, but the gate electrode could also be located in a depression within the substrate. The gate dielectric layer 14 separates the gate electrode 18 from the source electrode 20, drain electrode 22, and the semiconducting layer 12. The semiconducting layer 12 runs over and between the source and drain electrodes 20 and 22. The semiconductor has a channel length between the source and drain electrodes 20 and 22. A light source 24 is located so as to be able to illuminate the semiconducting layer 12 between the source electrode 20 and the drain electrode 22.

Figure 2:
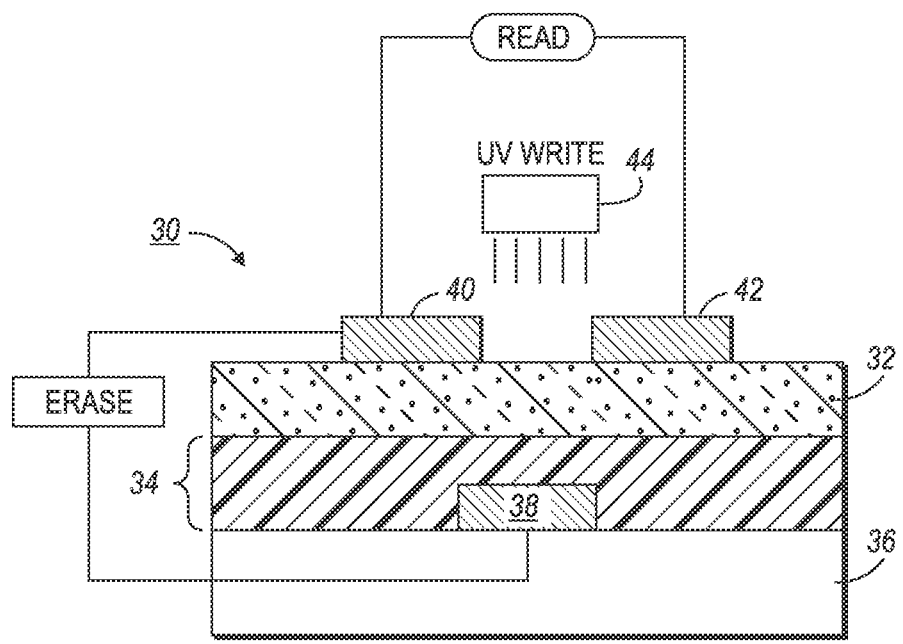
FIG. 2 is a diagram of a second embodiment of a TFT according to the present disclosure.

FIG. 2 illustrates a bottom-gate top-contact configuration for a memory device of the present disclosure. The device 30 comprises a substrate 36 in contact with the gate electrode 38 and a gate dielectric layer 34. The semiconducting layer 32 is placed on top of the gate dielectric layer 34, and is separated from the gate electrode thereby. The source and drain electrodes 40 and 42 are then placed on top of the semiconducting layer 32. A light source 44 is located so as to be able to illuminate the semiconducting layer 32 between the source electrode 40 and the drain electrode 42.

Figure 3:
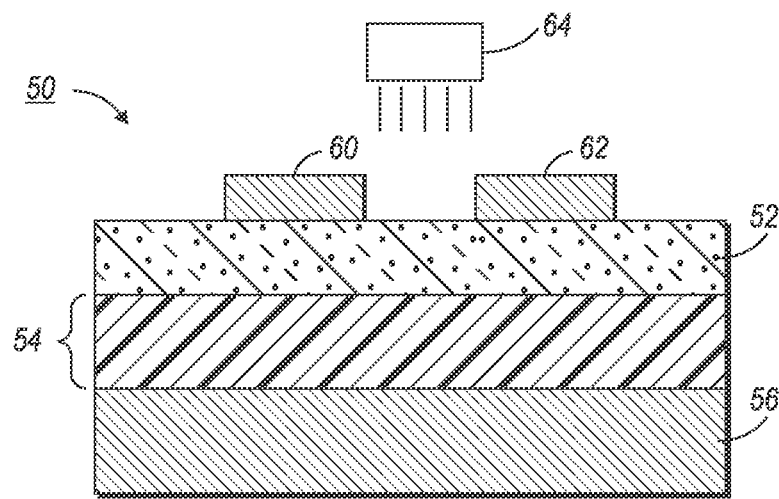
FIG. 3 is a diagram of a third embodiment of a TFT according to the present disclosure.

FIG. 3 illustrates a bottom-gate bottom-contact configuration for a memory device of the present disclosure. The device 50 comprises a substrate 56 which also acts as the gate electrode. The substrate is in contact with a gate dielectric layer 54. The semiconducting layer 52 is placed on top of the gate dielectric layer 54, and is separated from the gate electrode thereby. The source and drain electrodes 60 and 62 are then placed on top of the semiconducting layer 52. A light source 64 is located so as to be able to illuminate the semiconducting layer 52 between the source electrode 60 and the drain electrode 62.

Figure 4:
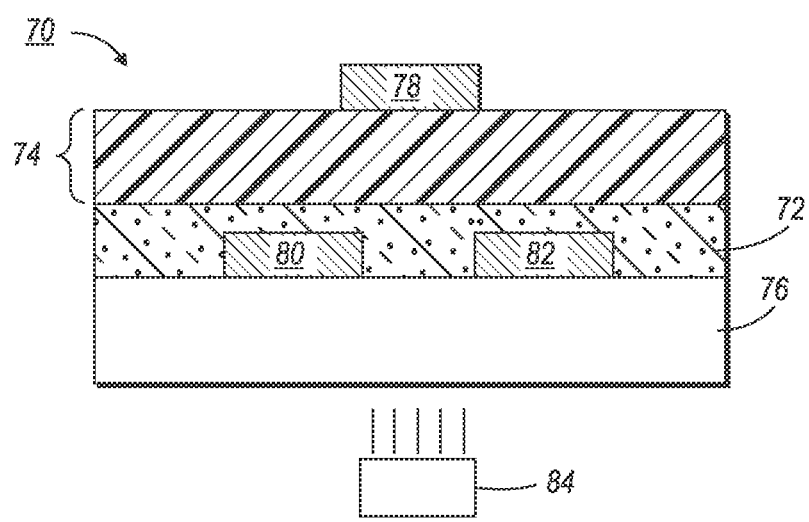
FIG. 4 is a diagram of a fourth embodiment of a TFT according to the present disclosure.

FIG. 4 illustrates a top-gate top-contact configuration for a memory device of the present disclosure. The device 70 comprises a substrate 76 in contact with the source electrode 80, drain electrode 82, and the semiconducting layer 72. The semiconducting layer 72 runs over and between the source and drain electrodes 80 and 82. The gate dielectric layer 74 is on top of the semiconducting layer 72. The gate electrode 78 is on top of the gate dielectric layer 74 and does not contact the semiconducting layer 72. A light source 84 is located so as to be able to illuminate the semiconducting layer 72 between the source electrode 80 and the drain electrode 82. Here, the substrate 76 is transparent and the light source 84 illuminates the semiconducting layer 72 through the substrate.

As noted above, the semiconducting layer comprises an organic semiconductor. The organic semiconductor can be an organic semiconducting compound or a semiconducting polymer.

Any suitable organic semiconductor can be used. In embodiments, the organic semiconductor compound may have the structure of Formula (I):

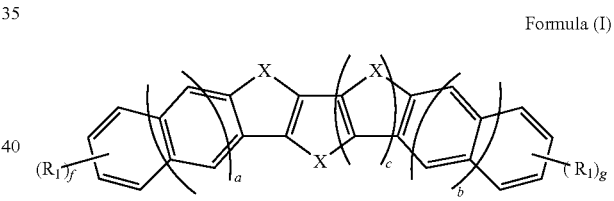

Formula (I)

wherein each $R_1$ is independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano (—CN), and halogen; f and g are the number of $R_1$ sidechains on their respective phenyl or naphthyl ring, and are independently an integer from 0 to 6; X is selected from the group consisting of O, S, and Se; and a, b, and c are independently 0 or 1. In this regard, when a or b is 0, the exterior portion of the compound will be a phenyl ring that may have up to 4 sidechains. When a or b is 1, the exterior portion of the compound will be a naphthyl ring that may have up to 6 sidechains.

The term "alkyl" refers to a radical composed entirely of carbon atoms and hydrogen atoms which is fully saturated. The alkyl radical may be linear, branched, or cyclic. Depending on the context, the radical may be monovalent or divalent.

The term "alkenyl" refers to a radical composed entirely of carbon atoms and hydrogen atoms which contains at least one carbon-carbon double bond. Depending on the context, the radical may be monovalent or divalent.

The term "alkynyl" refers to a radical composed entirely of carbon atoms and hydrogen atoms which contains at least one carbon-carbon triple bond. Depending on the context, the radical may be monovalent or divalent.

The term "aryl" refers to an aromatic radical composed entirely of carbon atoms and hydrogen atoms. When aryl is described in connection with a numerical range of carbon atoms, it should not be construed as including substituted aromatic radicals. For example, the phrase "aryl containing from 6 to 10 carbon atoms" should be construed as referring to a phenyl group (6 carbon atoms) or a naphthyl group (10 carbon atoms) only, and should not be construed as including a methylphenyl group (7 carbon atoms). Depending on the context, the radical may be monovalent or divalent.

The term "heteroaryl" refers to an aromatic radical composed of carbon atoms, hydrogen atoms, and one or more heteroatoms. The carbon atoms and the heteroatoms are present in a cyclic ring or backbone of the radical. The heteroatoms are selected from O, S, and N. Exemplary heteroaryl radicals include thienyl and pyridinyl. Depending on the context, the radical may be monovalent or divalent.

The term "alkoxy" refers to an alkyl radical which is attached to an oxygen atom, i.e. —O—$C_nH_{2n+1}$.

The term "alkylthio" refers to an alkyl radical which is attached to a sulfur atom, i.e. —S—$C_nH_{2n+1}$.

The term "trialkylsilyl" refers to a radical composed of a tetravalent silicon atom having three alkyl radicals attached to the silicon atom, i.e. —$Si(R)_3$. The three alkyl radicals may be the same or different. The alkyl radicals may be substituted or unsubstituted.

The term "aldehyde" refers to a radical of the formula —CO—R, where R is hydrogen or alkyl.

The term "cyano" refers to a radical of the formula —CN.

The term "halogen" refers to fluorine, chlorine, bromine, and iodine.

The term "substituted" refers to at least one hydrogen atom on the named radical being substituted with another functional group, such as halogen, —CN, —$NO_2$, —COOH, and —$SO_3H$. An exemplary substituted alkyl group is a perhaloalkyl group, wherein one or more hydrogen atoms in an alkyl group are replaced with halogen atoms, such as fluorine, chlorine, iodine, and bromine. Besides the aforementioned functional groups, an aryl or heteroaryl group may also be substituted with alkyl or alkoxy. Exemplary substituted aryl groups include methylphenyl and methoxyphenyl. Exemplary substituted heteroaryl groups include dodecylthienyl.

Generally, the alkyl and alkoxy groups each independently contain from 1 to 30 carbon atoms. Similarly, the aryl groups independently contain from 6 to 30 carbon atoms.

When a, b, and c are 0, X is sulfur, and f and g are each 1, the molecule of Formula (I) is also formally known as a disubstituted-[1]benzothieno[3,2-b]benzothiophene. The [1]benzothieno[3,2-b]benzothiophene moiety (when f and g are each 0) may be abbreviated herein as "BTBT". For example, with these limitations, the semiconductor compound of Formula (I) could be referred to as a disubstituted-BTBT.

In particular embodiments, the disubstituted-BTBT compound has the structure of Formula (II):

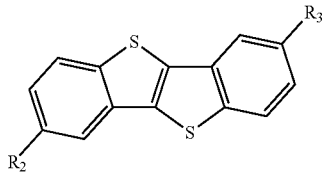

Formula (II)

wherein $R_2$ and $R_3$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, and halogen. This structure is obtained when a, b, and c are 0, X is sulfur, and f and g are each 1 in Formula (I).

In more specific embodiments of Formula (II), $R_2$ and $R_3$ are independently selected from alkyl and substituted alkyl. In one specific embodiment, the compound has the structure of Formula (II-a):

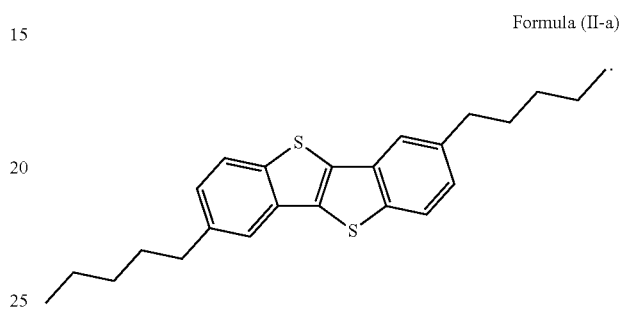

Formula (II-a)

In other particular embodiments, the disubstituted-BTBT compound has the structure of Formula (III):

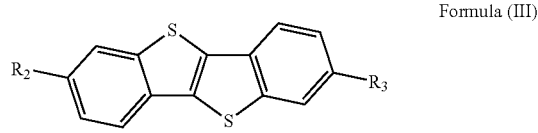

Formula (III)

wherein $R_2$ and $R_3$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, and halogen. This structure is also obtained when a, b, and c are 0, X is sulfur, and f and g are each 1 in Formula (I).

In still other embodiments, the organic semiconductor compound of Formula (I) has the structure of Formula (IV):

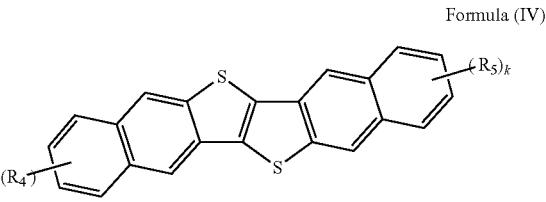

Formula (IV)

wherein each $R_4$ and $R_5$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, and halogen; and j and k are independently an integer from 0 to 6. This structure is obtained when a=b=1, c=0, and X is sulfur in Formula (I).

In still other embodiments, the organic semiconductor compound of Formula (I) has the structure of Formula (V):

Formula (V)

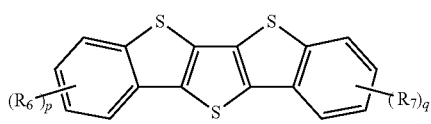

wherein each $R_6$ and $R_7$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, and halogen; and j and k are independently an integer from 0 to 4. This structure is obtained when a=b=0, c=1, and X is sulfur in Formula (I).

In still other embodiments, the organic semiconductor compound of Formula (I) has the structure of Formula (VI):

Formula (VI)

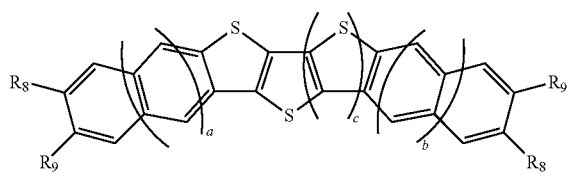

wherein $R_8$ and $R_9$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, and halogen. This structure is obtained when f=g=2, and X is sulfur in Formula (I).

In particular embodiments of Formula (VI), $R_8$ is halogen or cyano, and $R_9$ is alkyl, substituted alkyl, alkenyl, substituted alkenyl, or aldehyde. In other embodiments, $R_9$ is halogen or cyano, and $R_8$ is alkyl, substituted alkyl, alkenyl, substituted alkenyl, or aldehyde.

In other embodiments, the organic semiconductor compound has the structure of Formula (VII):

Formula (VII)

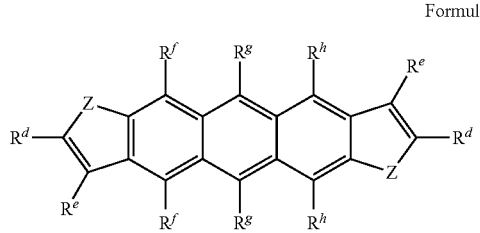

wherein $R^d$ through $R^h$ are independently selected from alkyl, substituted alkyl, alkenyl, substituted alkenyl, alkynyl, substituted alkynyl, trialkylsilylalkynyl, aryl, substituted aryl, heteroaryl, substituted heteroaryl, alkoxy, alkylthio, trialkylsilyl, aldehyde, cyano, and halogen; and Z is selected from the group consisting of O, S, Se, and —CH═CH—. When Z is sulfur (S), this compound is known as an anthra[2,3-b:6,7-b]dithiophene. When Z is —CH═CH—, this compound is a pentacene.

In more particular embodiments, the organic semiconductor compound of Formula (VII) has the structure of Formula (VIII):

Formula (VIII)

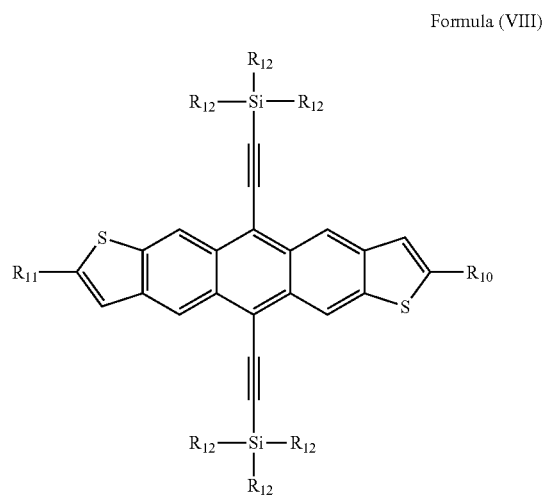

wherein $R_{10}$ and $R_{11}$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, and halogen; and wherein $R_{12}$ is alkyl or substituted alkyl. This structure is obtained when Z is sulfur in Formula (VII); $R^e$=$R^f$=$R^h$=hydrogen, and $R^9$ is trialkylsilylethynyl.

Two specific embodiments of Formula (VIII) are illustrated below in Formulas (VIII-a) and (VIII-b):

Formula (VIII-a)

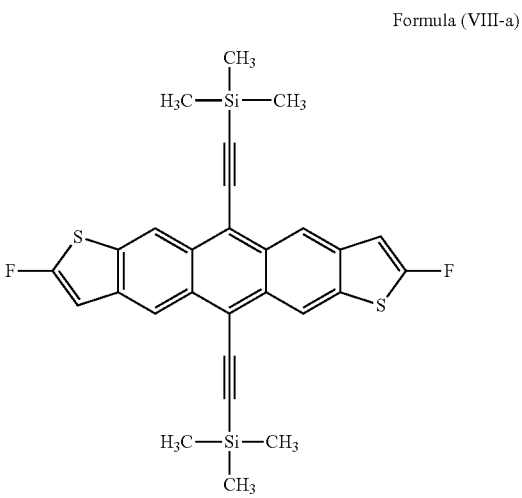

-continued

Formula (VIII-b)

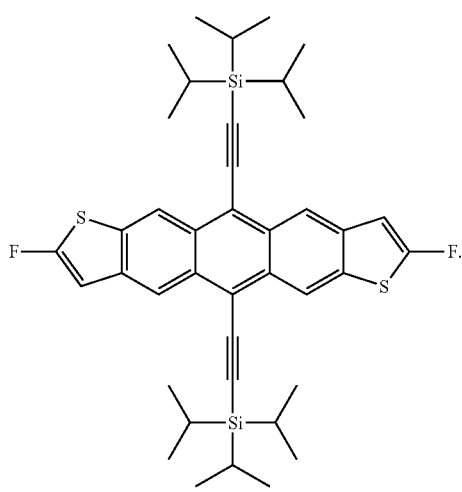

In other particular embodiments, the organic semiconductor compound of Formula (VII) has the structure of Formula (IX):

Formula (IX)

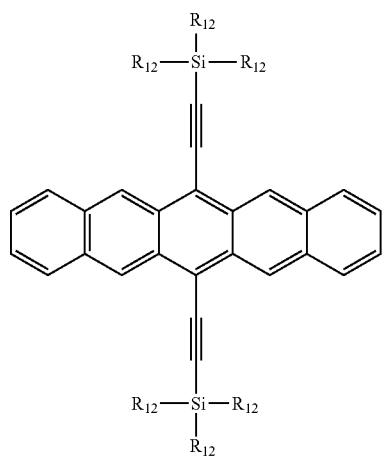

wherein $R_{12}$ is alkyl or substituted alkyl. This structure is obtained when Z is —CH=CH— in Formula (VII); $R^e=R^f=R^h$=hydrogen, and $R^9$ is trialkylsilylethynyl.

Various methods known in the arts can be used to make the organic semiconductor compounds disclosed herein. For example, methods of producing the compound of Formula (II) include reacting a 3,8-dihalo-BTBT A with an alkyne to form a 3,8-dialkyn-1-yl-BTBT 1. This initial reaction is illustrated below:

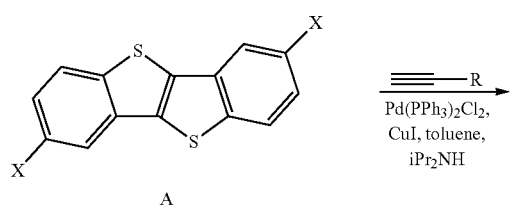

wherein X is a halogen, R is alkyl, $Ph(PPh_3)_2Cl_2$ is bis(triphenylphosphine) palladium(II) chloride, CuI is copper iodide, and $iPr_2NH$ is diisopropylamine. As shown here, the two R groups are identical. However, the two R groups can be different as well, for example by using a blocking/protecting group on one of the X groups, performing a first reaction with a first alkyne to convert the unprotected X group, removing the blocking/protecting group, then subsequently performing a second reaction with a second different alkyne.

Next, the 3,8-dialkyn-1-yl-BTBT 1 can be reduced to a 3,8-dialkyl-[1]benzothieno[3,2-b]benzothiophene 1a as depicted below:

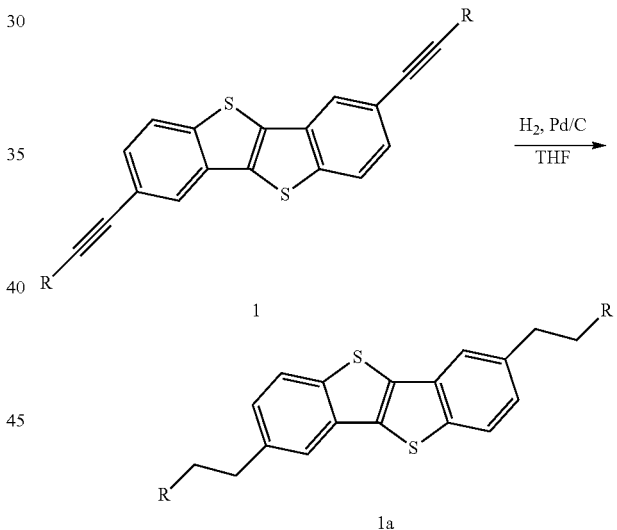

wherein Pd/C is a palladium on carbon catalyst and THF is tetrahydrofuran. Similar reactions can be performed for the other possible $R_a$ substituents.

Methods for preparing compounds 1a also includes the reaction of the [1]benzothieno[3,2-b]-benzothiophene core B with a substituted acid chloride in presence of aluminum trichloride to form a 3,8-diketonyl BTBT 2.

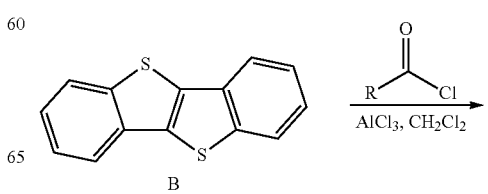

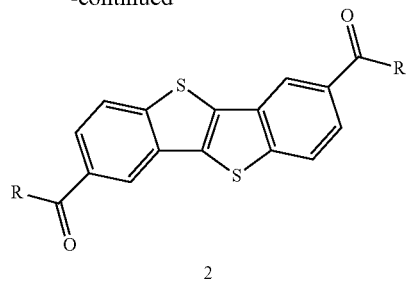

Next, the dialdehyde BTBT 2 is deoxygenated using a modified Wolff-Kishner reduction using hydrazine in the presence of potassium hydroxide in diethylene glycol. This forms 3,8-dialkyl-[1]benzothieno[3,2-b]benzothiophene 1b.

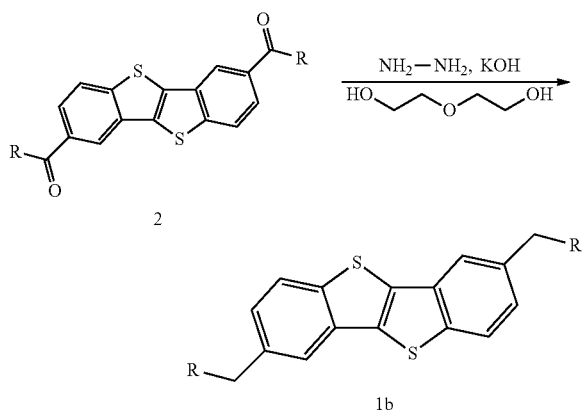

This 2-step method is particularly effective for short R substituents ($C_2$-$C_8$).

Alternatively, the organic semiconductor in the semiconducting layer can be a semiconducting polymer. Such polymers are known in the art, and include for example, poly(triarylamine)s, polythiophenes, poly(p-phenylene vinylene), polypyrroles, polyanilines, polyfluorenes, polypyrenes, diketopyrrolopyrrole copolymers, and poly(3,4-ethylenedioxythiophene). The semiconducting polymers disclosed in U.S. Pat. Nos. 7,932,344 and 8,558,109 illustrate some polymers which can be used, and are fully incorporated by reference herein.

The organic semiconductor may have a band gap of from about 1.2 to about 3.5 eV, including from about 1.8 to about 3.5 eV or from about 2.0 to about 3.5 eV. In some embodiments, the organic semiconductor may have a wide band gap of from about 2.5 (absorbance less than 500 nm) to about 3.5 eV. The organic semiconductor has a crystalline or liquid crystalline structure. In specific embodiments, the semiconductor compounds of Formulas (I) or (VII) are colorless in the visible region of the electromagnetic spectrum (i.e. from 390 nm to 750 nm). Colorless semiconductors not only provide excellent stability due to their large band gaps, but also offer advantage in transparency for transparent device applications. In the present disclosure, colorless semiconductors provide excellent transparency for photons to reach the photo-responsive moieties of the photo-responsive material in the semiconducting layer.

Besides the organic semiconductor, the semiconducting layer also includes a photo-responsive material. The photo-responsive material may be present as a photo-responsive compound or in a photo-responsive polymer. A photo-responsive moiety is part of the photo-responsive material. The term "photo-responsive" means that the moiety will, upon external stimulation such as exposure to irradiation at a suitable wavelength, undergo a reversible structural change. In some specific embodiments, the irradiation is performed using a laser with wavelength from about 190 nm to about 1090 nm. More specifically, the irradiation is of ultraviolet light, having a maximum wavelength ($\lambda_{max}$) of 400 nanometers to 190 nanometers. The light source for illuminating the semiconducting layer and the photo-responsive material therein can be any structure known in the art, such as a light emitting diode (LED), light guide, light bulb, lamp, etc. In some embodiments, the irradiation is performed using a pulse laser; in other embodiments, the irradiation is performed using a continuous wave (CW) laser. In particular embodiments, the photo-responsive material undergoes cis-trans isomerization upon exposure to irradiation.

In embodiments, the photo-responsive compound can be any compound other than a spiropyran compound. For example, the photo-responsive compound can be an azobenzene, a coumarin, a cinnamate, a dithiazolylarylene, a diarylethene, a stilbene, or an aromatic Schiff base.

An azobenzene, stilbene, or aromatic Schiff base can be generally represented by the structure of Formula (A):

Formula (A)

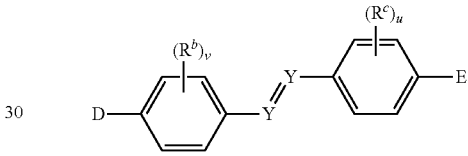

wherein each $R^b$ and $R^c$ is independently selected from alkyl, substituted alkyl, alkenyl, substituted alkenyl, alkynyl, substituted alkynyl, heteroaryl, substituted heteroaryl, alkoxy, alkylthio, trialkylsilyl, aldehyde, cyano, halogen, hydroxyl, amino, thiol, or nitro; u and v are independently integers from 0 to 4; D is an electron donor group; E is an electron acceptor group; and each Y is independently N or CH.

When both Y's are nitrogen, Formula (A) is an azobenzene. When both Y's are CH, Formula (A) is a stilbene. When one Y is nitrogen and the other Y is CH, Formula (A) is an aromatic Schiff base. An example of an azobenzene is the dye Disperse Red 1.

The term "hydroxyl" refers to a radical of the formula —OH.

The term "amino" refers to a radical of the formula —$NR^1R^2$, wherein $R^1$ and $R^2$ are independently hydrogen or alkyl, or to a radical of the formula —$N^+R^1R^2R^3$, wherein $R^1$, $R^2$, and $R^3$ are independently hydrogen or alkyl. Please note this second radical is sometimes referred to as an "ammonium" ion. An amino radical may also be divalent, i.e. —($NR^1$)—.

The term "thiol" refers to a radical of the formula —SH.
The term "nitro" refers to a radical of the formula —$NO_2$.

An electron donor group has high electron density. Exemplary electron donor groups include hydroxyl, amino, alkoxy, alkyl, aryl, vinyl, and combinations thereof. An electron acceptor group has low electron density. Exemplary electron acceptor groups include halogen, aldehyde, carboxyl, perfluoroalkyl, cyano, nitro, sulfinyl, sulfonyl, and combinations thereof. Hydrogen can be considered either an electron donor or an electron acceptor.

The term "carboxyl" refers to a radical of the formula —CO—OR, where R is hydrogen or alkyl.

The term "sulfinyl" refers to a radical of the formula —SO—X, where X is a halogen.

The term "sulfonyl" refers to a radical of the formula —SO2-X, where X is a halogen.

A coumarin can be represented by the structure of Formula (B):

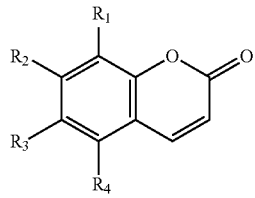

Formula (B)

wherein $R_1$, $R_2$, $R_3$, and $R_4$ are independently hydrogen, alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, halogen, hydroxyl, amino, thiol, or nitro, or wherein R groups can be joined together to form a ring. Upon exposure to irradiation, two coumarin groups will crosslink, as illustrated below:

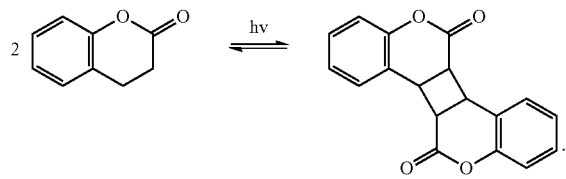 [SMILES: O=C1CCc2ccccc2O1 ; O=C1Oc2ccccc2C2C1C1c3ccccc3OC(=O)C21]

A cinnamate can be represented by the structure of Formula (C):

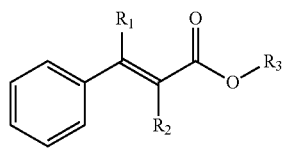

Formula (C)

wherein $R_1$, $R_2$, and $R_3$ are independently hydrogen, alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, halogen, hydroxyl, amino, thiol, or nitro, or wherein R groups can be joined together to form a ring (particularly $R_2$ and $R_3$). Similar to coumarin, cinnamate can undergo 2+2 cyclization reaction upon irradiation.

A dithiazolylarylene can be represented by the structure of Formula (D):

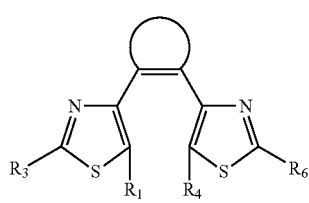

Formula (D)

wherein $R_1$, $R_3$, $R_4$, and $R_6$ are independently hydrogen, alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, halogen, hydroxyl, amino, thiol, or nitro, or wherein R groups can be joined together to form a ring. Upon exposure to irradiation, the double bonds will reorganize, as illustrated below:

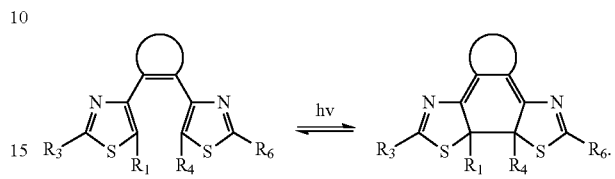

A diarylethene can be represented by the structure of Formula (E):

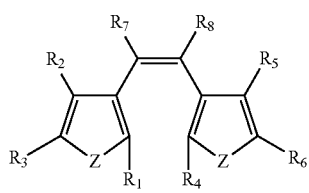

Formula (E)

wherein Z is independently O, S, or NR; and $R_1$, $R_2$, $R_3$, $R_4$, $R_5$, $R_6$, $R_7$, and $R_8$ are independently hydrogen, alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, halogen, hydroxyl, amino, thiol, or nitro; and wherein two adjacent R groups can be joined together to form a ring. It is specifically contemplated, for example, that $R_2$ and $R_3$ can form a phenyl ring, and $R_5$ and $R_6$ can form a phenyl ring. In preferred embodiments, $R_7$ and $R_8$ form a ring. Upon exposure to irradiation, the double bonds will reorganize, as illustrated below:

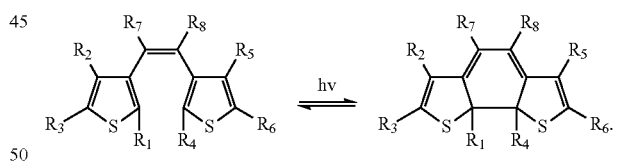

When the photo-responsive material is a photo-responsive polymer, the photo-responsive moiety is usually present as a pendant group (i.e. sidechain). Put another way, the photo-responsive polymer includes a backbone with pendant groups attached thereto, and the pendant groups include the moiety that will undergo the reversible structural change. The photo-responsive polymer can be considered as forming a matrix within which the organic semiconductor compound is dispersed. In particular embodiments, the photo-responsive polymer includes pendant groups that undergo cis-trans isomerization upon exposure to irradiation. In other embodiments, the photo-responsive moiety is present in the backbone of the photo-responsive polymer. For example, such photo-responsive polymers are disclosed in *Macromolecules*, 2004, vol 37, pp 6090, and *Macromolecules*, 2001, vol 34, pp. 7822.

It is contemplated that in a photo-responsive polymer, the photo-responsive moiety can be selected from the group consisting of an azobenzene group, a spiropyran group, a coumarin group, a cinnamate group, a dithiazolylarylene group, a diarylethene group, a stilbene group, and an aromatic Shiff base group. These groups are as depicted above in Formulas (A)-(E), with one of the R groups including a linkage to the polymer backbone.

A spiropyran group has the structure of Formula (F):

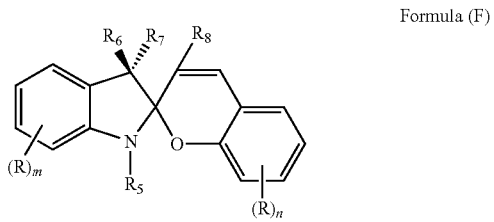

Formula (F)

wherein $R_5$, $R_6$, $R_7$, and $R_8$ are independently hydrogen, alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, halogen, hydroxyl, amino, thiol, or nitro; each R is independently selected from the same groups as described above for $R_5$ except for hydrogen and m and n are independently integers from 0 to 4. One of the R groups will form a linkage to the polymer backbone.

In more specific embodiments, the photo-responsive polymer includes a monomer of Formula (G):

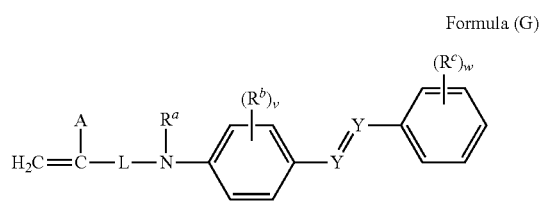

Formula (G)

wherein A is hydrogen, alkyl, or halogen; L is a divalent linkage; $R^a$ is hydrogen or alkyl; each $R^b$ and $R^c$ is independently selected from alkyl, substituted alkyl, alkenyl, substituted alkenyl, alkynyl, substituted alkynyl, heteroaryl, substituted heteroaryl, alkoxy, alkylthio, trialkylsilyl, aldehyde, cyano, halogen, hydroxyl, amino, thiol, or nitro; v is an integer from 0 to 4; w is an integer from 0 to 5; and each Y is independently N or CH.

The term "divalent linkage" refers to any moiety which is able to form a single bond with two different non-hydrogen atoms, joining those two different atoms together. A divalent linkage can be formed from the combination of different radicals, for example from the combination of an ester (—CO—O—) group and an alkyl group. An exemplary divalent linkage is —CO—O—$(CH_2)_m$—, where m is an integer from 1 to 6.

The monomer of Formula (G) will undergo polymerization through the vinyl group. Depending on the identity of Y, the pendant group will contain either a stilbene group or an azobenzene group, which can undergo cis-trans isomerization upon irradiation. In particular embodiments, Y is nitrogen, i.e. the pendant group contains an azobenzene group.

A specific example is the monomer of Formula (G-1), which is also known as Disperse Red 1 methacrylate:

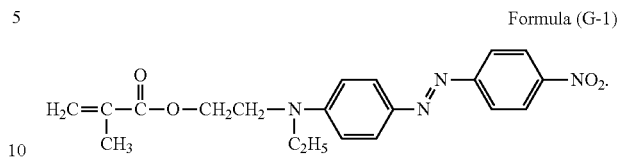

Formula (G-1)

The photo-responsive polymer can be a copolymer or a dipolymer. The term "copolymer" is used herein to refer to a polymer having two or more monomers, while the term "dipolymer" is used to refer to a polymer having only two monomers. The monomer of Formula (G) may be from about 1 mole % to about 50 mole % of the copolymer, including from about 5 to about 15 mol % of the copolymer.

In more specific embodiments, the photo-responsive polymer includes an acrylate co-monomer along with the monomer of Formula (G). An acrylate monomer has the structure of Formula (H):

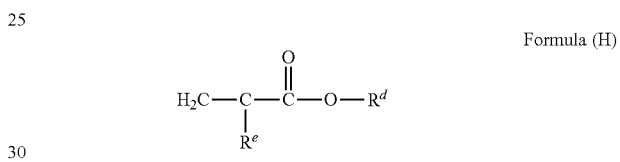

Formula (H)

where $R^d$ is alkyl; and $R^e$ is hydrogen, alkyl, or halogen. Exemplary co-monomers include methyl methacrylate and methyl acrylate.

One exemplary photo-responsive polymer is a copolymer of Disperse Red 1 methacrylate and methyl methacrylate, as illustrated in Formula (a):

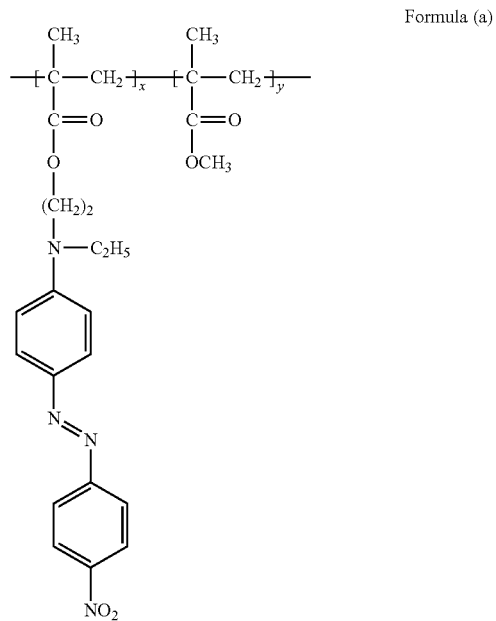

Formula (a)

where x and y are the mole fraction of the respective monomer, and each have a value between 0 and 1 (exclusive). In more specific embodiments, x is from about 0.05 to about 0.15, and y is from about 0.85 to about 0.95. The molar ratio of x:y can be from about 1:19 to about 3:17, and in some particular embodiments is about 1:10.

The photo-responsive polymer may have a weight average molecular weight of 2,000 to about 2,000,000, including from about 4,000 to about 1,000,000, when measured according to gel permeation chromatography (GPC) using polystyrene standards. The weight ratio of the organic semiconductor compound to the photo-responsive polymer in the semiconducting layer can be from about 25:75 to about 95:5, including from about 25:75 to about 75:25.

In specific embodiments, the semiconducting layer comprises an organic semiconducting compound and a photo-responsive polymer as described above. In other specific embodiments, the semiconducting layer comprises an organic semiconducting polymer and a photo-responsive compound that is not a spiropyran, as described above. When both an organic semiconductor compound and a photo-responsive compound are used, a non-photo-responsive polymer resin is usually included as a binder, but is optional. Exemplary non-photo-responsive polymer resins include the acrylates such as poly(methyl methacrylate), and polystyrene, and the like.

In particular embodiments, the difference between the HOMO level of the organic semiconductor and the HOMO level of the photo-responsive polymer is not greater than 0.5 eV, and is preferably less than 0.3 eV. Similarly, in particular embodiments the difference between the HOMO level of the organic semiconductor and the HOMO level of the photo-responsive compound is not greater than 0.5 eV, and is preferably less than 0.3 eV.

The semiconducting layer can be formed from a semiconductor solution containing the organic semiconductor (compound or polymer), the photo-responsive moiety (compound or polymer), and a solvent in which both are soluble. Exemplary solvents used in the solution may include chlorinated solvents such as chlorobenzene, chlorotoluene, dichlorobenzene, dichloroethane, chloroform, trichlorobenzene, and the like; alcohols and diols such as propanol, butanol, hexanol, hexanediol, etc.; hydrocarbons or aromatic hydrocarbons such as hexane, heptane, toluene, decalin, xylene, ethyl benzene, tetrahydronaphthalene, methyl nanphthalene, mesitylene, trimethyl benzene, etc.; ketones such as acetone, methyl ethyl ketone, etc.; acetates, such as ethyl acetate; pyridine, tetrahydrofuran, and the like.

The organic semiconductor and the photo-responsive moiety (compound or polymer) are from about 0.05 to about 20 weight percent of the semiconductor solution, including from about 0.1 to about 10 weight percent of the semiconductor solution, or from about 1 to about 5 weight percent of the semiconductor solution. It is noted that when the molecular weight of the photo-responsive polymer is higher, the viscosity of the solution will be greater. This can help when forming a uniform semiconducting layer using solution deposition techniques such as inkjet printing and spin coating.

The semiconducting layer may be formed in the memory device using conventional processes known in the art. In embodiments, the semiconducting layer is formed using solution depositing techniques. Exemplary solution depositing techniques include spin coating, blade coating, rod coating, dip coating, screen printing, ink jet printing, stamping, stencil printing, screen printing, gravure printing, flexography printing, and the like.

After being deposited, the semiconductor solution is optionally thermally treated (for example, by drying or annealing) at an elevated temperature which is lower than the melting point of the organic semiconductor. For example, the thermal treatment may be carried out at a temperature of less than 200° C., less than 150° C., or less than 100° C.

The semiconducting layer formed using the semiconductor solution can be from about 5 nanometers to about 1000 nanometers deep, including from about 20 to about 100 nanometers in depth. In certain configurations, such as the configurations shown in FIG. 1 and FIG. 4, the semiconducting layer completely covers the source and drain electrodes.

A memory device using the semiconducting layer described herein can be operated as follows, with reference to FIG. 2. Two electrodes (source and drain) contact the semiconducting layer, and the resistance/current between these two electrodes is read. The resistance can be switched from a first or "original" state to a second or "activated" state by irradiation with UV light. In the original state, the resistance is high and the current is low. In the activated state, the resistance is low and the current is high. These values of "high" and "low" are relative to each other, and are not based on an absolute reference.

The current will increase substantially upon irradiation. The device will remain in the activated state when the light source is then turned off. In the activated state, the gate bias will have a first value, which is relatively low, between 0V and about −5V. Upon application of a large voltage, for example from a second value of −20V to −60V, an intermediate state will exist in which the current further increases. When the gate bias voltage then returns to the first value, the device will return to the original state. The second value of the gate bias voltage has a greater absolute magnitude than the first value of the gate bias voltage.

Without being bound by theory, it is believed that the strong donor-acceptor photo-responsive moieties create charge trapping sites in the semiconducting layer. At high gate bias, the charge carriers are trapped around the azobenzene/stilbene moieties of the polymer. Upon irradiation, the isomerization (from lower-energy trans state to higher-energy cis state) and the photovoltaic effect will cause the charge carriers to be released, resulting in high current.

The memory device can be operated at various conditions. For example, the device can be operated with a source/drain voltage from about −5V to about −60V, and the gate bias can be from about 0V to about −5V.

The memory device is very similar to a thin film transistor and generally includes a substrate, an optional gate electrode, source electrode, drain electrode, and a dielectric layer in addition to the semiconducting layer.

The substrate may be composed of materials including but not limited to silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 0.5 to about 10 millimeters for a rigid substrate such as glass or silicon. The substrate may be opaque, or can be transparent so that ultraviolet light can pass through the substrate.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about $10^{-12}$ Siemens per centimeter (S/cm). The dielectric layer is formed using conventional processes known in the art, including those processes described in forming the gate electrode.

The dielectric layer may be surface modified with a surface modifier. The semiconducting layer can be directly contacted with this modified dielectric layer surface. The contact may be complete or partial. This surface modification can also be considered as forming an interfacial layer between the dielectric layer and the semiconducting layer. Exemplary surface modifying agents include organosilanes such as hexamethyldisilazane and octyltrichlorosilane.

The gate electrode is composed of an electrically conductive material. It can be a thin metal film, a conducting polymer film, a conducting film made from conducting ink or paste, or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges for example from about 10 to about 200 nanometers for metal films and from about 1 to about 10 micrometers for conductive polymers. Typical materials suitable for use as source and drain electrodes include those of the gate electrode materials such as aluminum, gold, silver, chromium, zinc, indium, conductive metal oxides such as zinc-gallium oxide, indium tin oxide, indium-antimony oxide, conducting polymers and conducting inks. Typical thicknesses of source and drain electrodes are, for example, from about 40 nanometers to about 1 micrometer, including more specific thicknesses of from about 100 to about 400 nanometers.

Typical materials suitable for use as source and drain electrodes include those of the gate electrode materials such as gold, silver, nickel, aluminum, platinum, conducting polymers, and conducting inks. In specific embodiments, the electrode materials provide low contact resistance. Typical thicknesses are about, for example, from about 40 nanometers to about 1 micrometer with a more specific thickness being about 100 to about 400 nanometers.

The devices of the present disclosure contain a semiconductor channel. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The various components of the memory device may be deposited upon the substrate in any order. Generally, however, the gate electrode and the semiconducting layer should both be in contact with the gate dielectric layer. In addition, the source and drain electrodes should both be in contact with the semiconducting layer. The phrase "in any order" includes sequential and simultaneous formation. For example, the source electrode and the drain electrode can be formed simultaneously or sequentially. The term "on" or "upon" the substrate refers to the various layers and components with reference to the substrate as being the bottom or support for the layers and components which are on top of it. In other words, all of the components are on the substrate, even though they do not all directly contact the substrate. For example, both the dielectric layer and the semiconducting layer are on the substrate, even though one layer is closer to the substrate than the other layer. The resulting TFT has good mobility and good current on/off ratio.

The following examples are for purposes of further illustrating the present disclosure. The examples are merely illustrative and are not intended to limit devices made in accordance with the disclosure to the materials, conditions, or process parameters set forth therein. All parts are percentages by volume unless otherwise indicated.

EXAMPLES

In the examples, various materials were studied. They include the copolymer of Formula (a), 3,8-dipentyl-BTBT, azobenzene, and poly(methyl methacrylate) (PMMA), as illustrated below. In the copolymer, the azobenzene repeat unit was about 10 mole % of the copolymer (i.e. x~0.10). As controls, an azobenzene compound and PMMA were used.

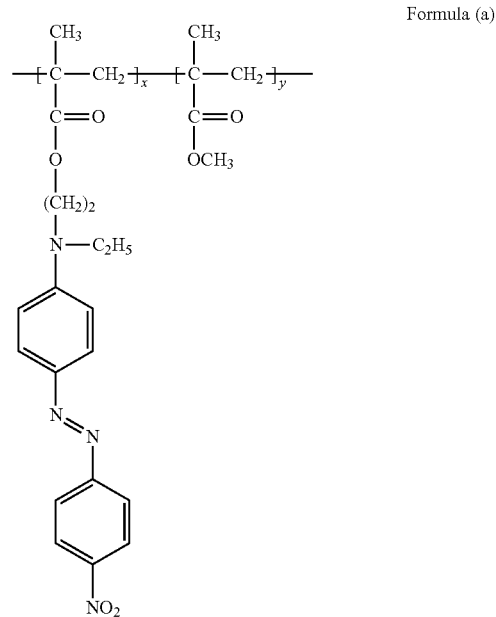

Formula (a)

-continued

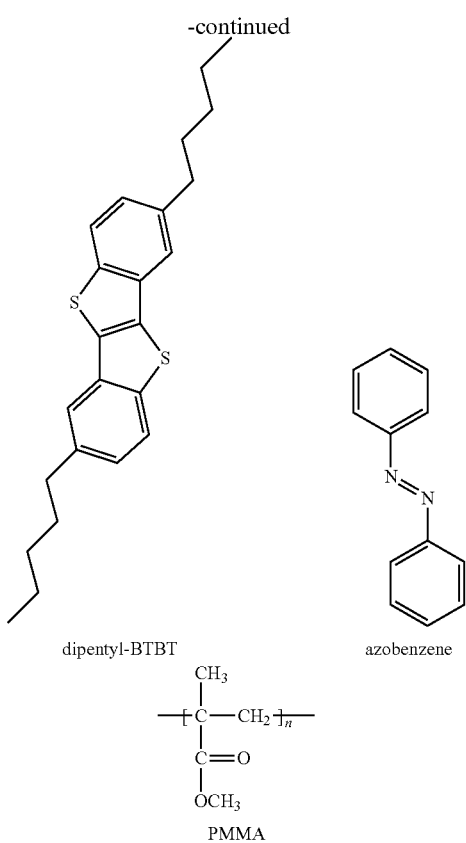

dipentyl-BTBT azobenzene

PMMA

Example 1

Memory devices were fabricated in a similar manner to an organic thin film transistor. N-doped silicon with a 200-nm silicon oxide layer was used as the substrate. The surface of the silicon oxide layer was modified with HMDS, yielding a self-assembled monolayer. A semiconductor composition was prepared, comprising 1.0 wt % dipentyl-BTBT and 1.0 wt % of the polymer of Formula (a) in a chlorobenzene solvent. The semiconductor composition was spin coated on top of the modified HMDS layer at 3000 rpm, forming about a semiconducting layer of about 50 nanometers (nm) in thickness. The substrate/semiconducting layer was dried in a vacuum oven at 70° C. for 30 minutes. Gold source and drain electrodes were vapor-evaporated onto the semiconducting layer through a shadow mask. The device had a channel length (gap between the source/drain electrodes) of 90 micrometers, and had a channel width (the length of the electrodes) of 1 millimeter (mm).

Figure 5:
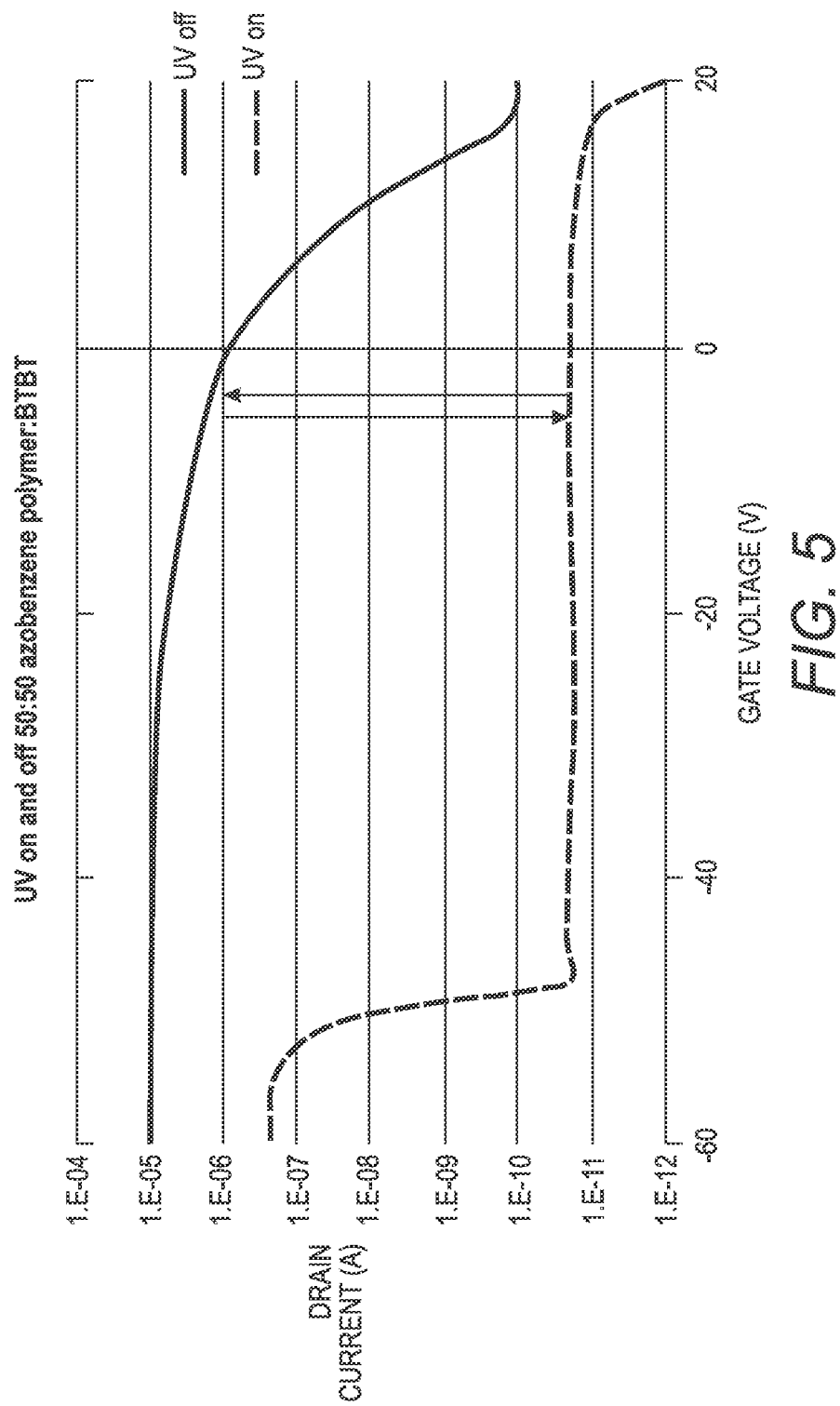
FIG. 5 is a current versus voltage graph for a device of the present disclosure including an organic semiconductor compound and photo-responsive polymer in a 1:1 weight ratio, showing two curves (with and without UV illumination). The two curves are very different.

The device was operated in standard transistor mode by applying a drain voltage of −60 V and sweeping the gate voltage from +20 V to −60 V. Referring to FIG. 5, the device turned on at gate voltage about −50 V. At low gate voltage from about −40 V to 0 V, the current was very low. Upon irradiating the semiconducting layer with a UV light, the current increased dramatically, particularly at low gate bias. Therefore, the device should be able to switch between an "on" and an "off" state at low or no gate bias (indicated by the arrows) by irradiating with UV light to "write", and applying a large gate bias to "erase" the bi-stable states.

Figure 6:
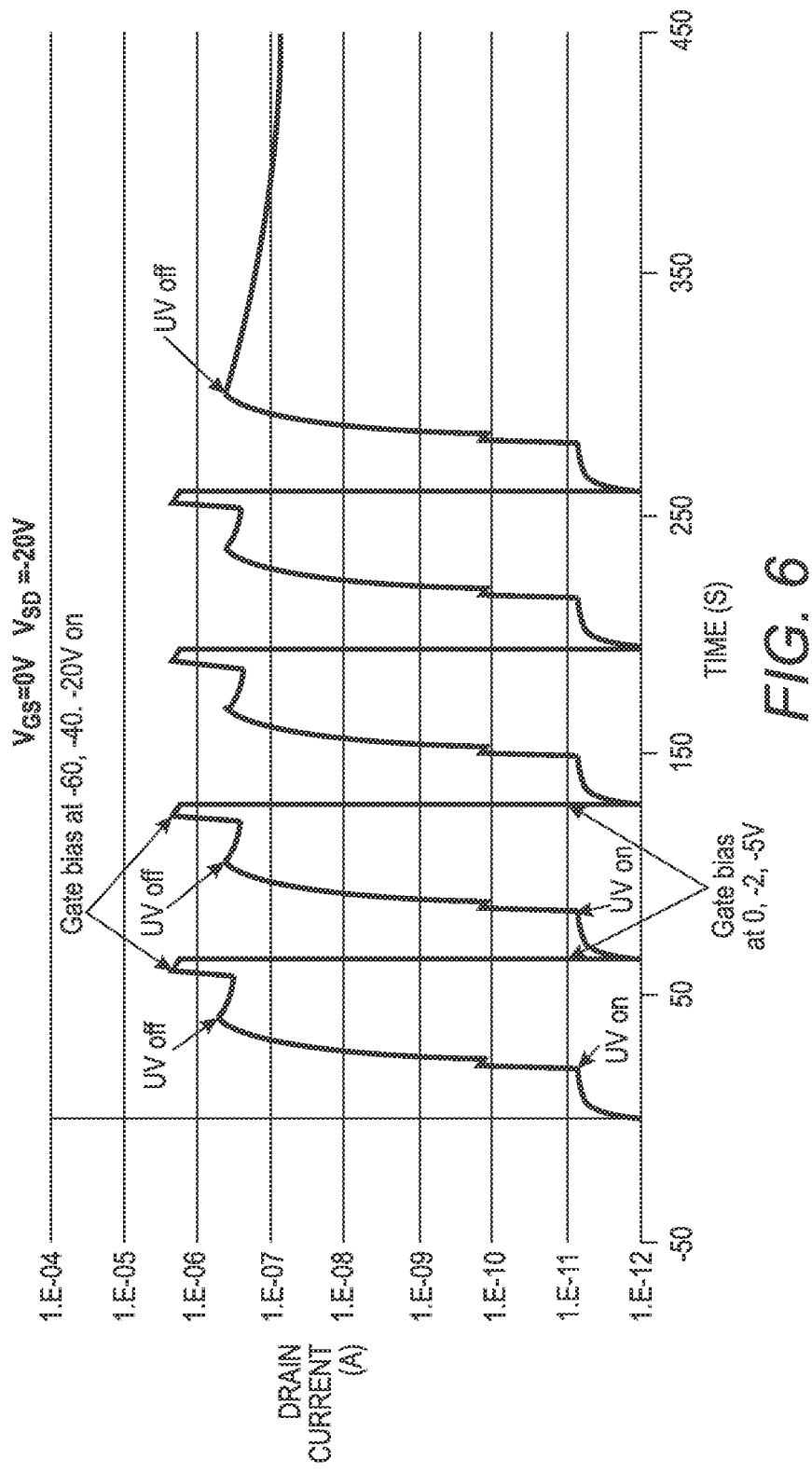
FIG. 6 is a current versus time graph illustrating the memory effect of "writing" via UV illumination and "erase" via application and removal of a large gate bias.

FIG. 6 shows the device operating in memory mode. At no gate bias and a reading voltage of −20V, the device originally was at off state, having a very low current less than $10^{-11}$ A (time around zero seconds). Upon irradiating with UV light at approximately 25 seconds, the device was turned on and the current increased dramatically to $10^{-6}$ A, an on/off ratio >$10^5$. The UV light was turned off at about 40 seconds, and the current remained high (~$10^{-6}$ A). A slow decay of the current was observed. Upon applying a large gate bias at −60 V at approximately 50 seconds, an intermediate state was observed where the current further increased. This process erased the UV irradiation effect. When the gate bias was set back to 0 at about 70 seconds, the device returned to its original low-current state. This was repeated, and the graph shows very reproducible on/off behavior. It should be noted that all measurements were performed in ambient conditions. The device was stable for a few weeks upon writing and erasing for thousands of cycles.

The same behavior occurred when a large gate bias of −40 V and a low gate bias of −2 V was used, and when a large gate bias of −20 V and a low gate bias of −5 V was used (not shown).

Control

Figure 7:
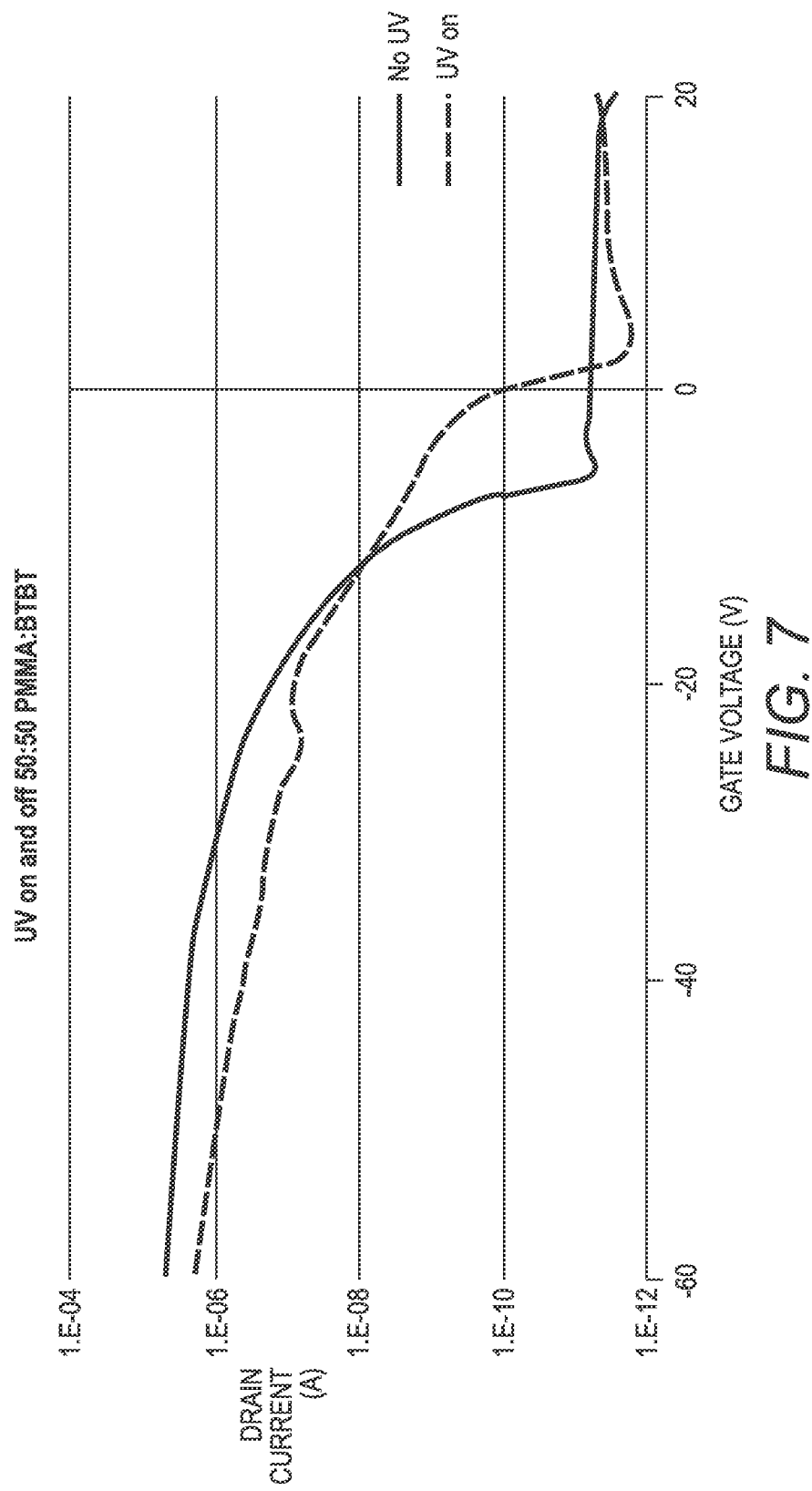
FIG. 7 is a current versus voltage graph for a control containing a non-photo-responsive polymer and an organic semiconductor compound, showing two curves (with and without UV illumination).

Control experiments were carried out to determine whether the results were due solely to the photovoltaic effect (i.e. current created upon exposure to light). Dipentyl-BTBT was mixed with a PMMA polymer at 1:1 weight ratio, and the device was tested by measuring the I-V curve with and without UV irradiation. FIG. 7 shows the result. Although irradiating with UV light caused a slight shift in the turn-on voltage and slightly increased the current at low gate bias, the curves were dramatically different from the system using a photo-responsive polymer. Compare FIG. 5 to FIG. 7. This indicated that the memory effect was not due simply to the photovoltaic effect.

Figure 8:
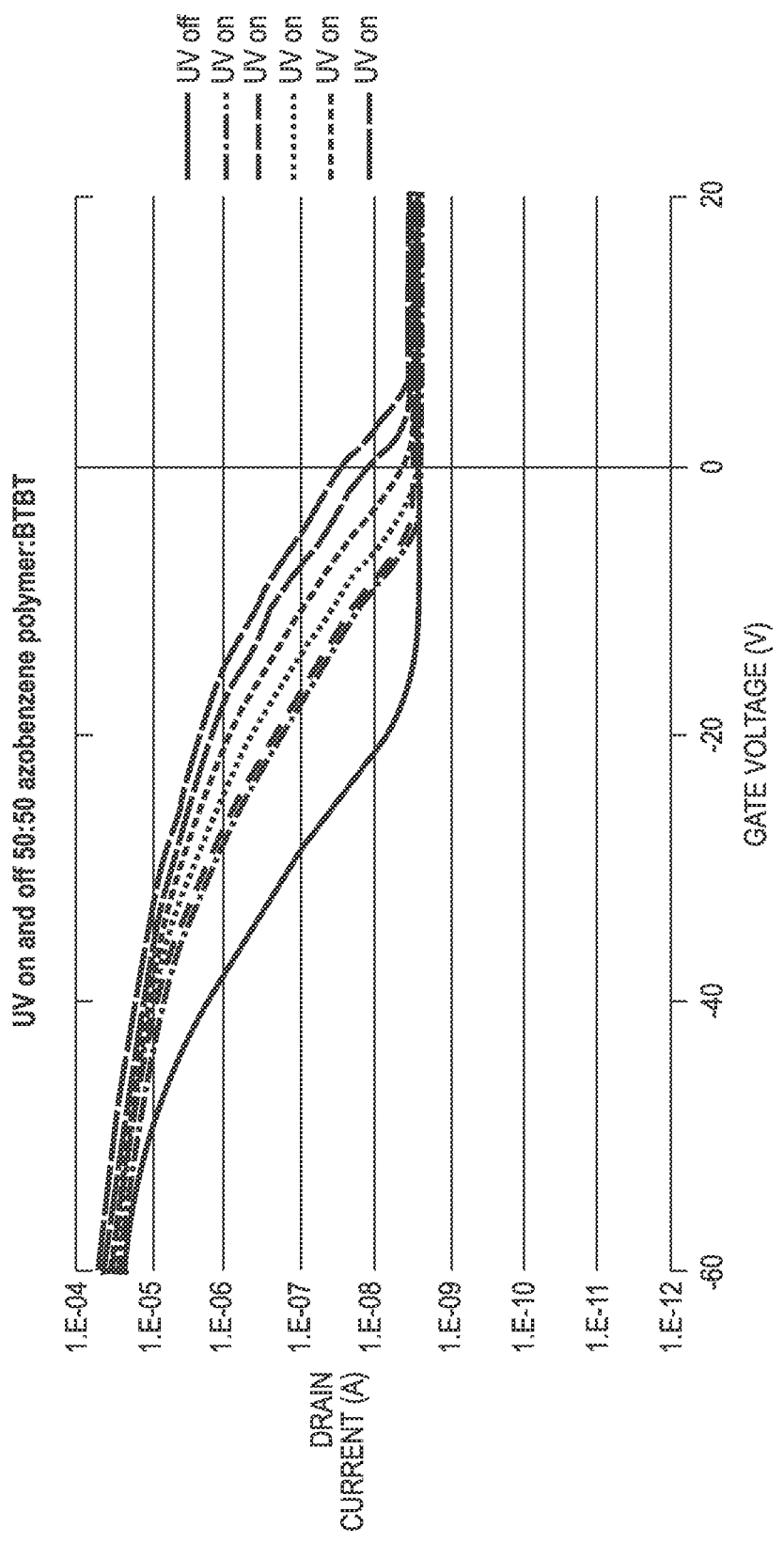
FIG. 8 is a current versus voltage graph for a control containing a polymer, a photo-responsive compound, and an organic semiconductor compound, showing two curves (with and without UV illumination).

Next, the azobenzene compound was mixed with PMMA and dipentyl-BTBT in a weight ratio of 45:5:50 PMMA: azobenzene:BTBT (to obtain a similar amount of azobenzene compared to the polymer in Example 1), and tested. The results are shown in FIG. 8. Upon irradiation with UV light, the turn-on voltage shifted towards the positive regime (i.e. to the right), and the current increased at low gate bias. However, the magnitude of shifting and the current enhancement was much smaller than the system using a photo-responsive polymer. Compare FIG. 5 to FIG. 8. This indicated that a photo-responsive material was needed, and that the design of the photo-responsive material affected the on/off ratio. Using a polymer containing the azobenzene moiety was more effective than just using azobenzene as a compound.

Figure 9:
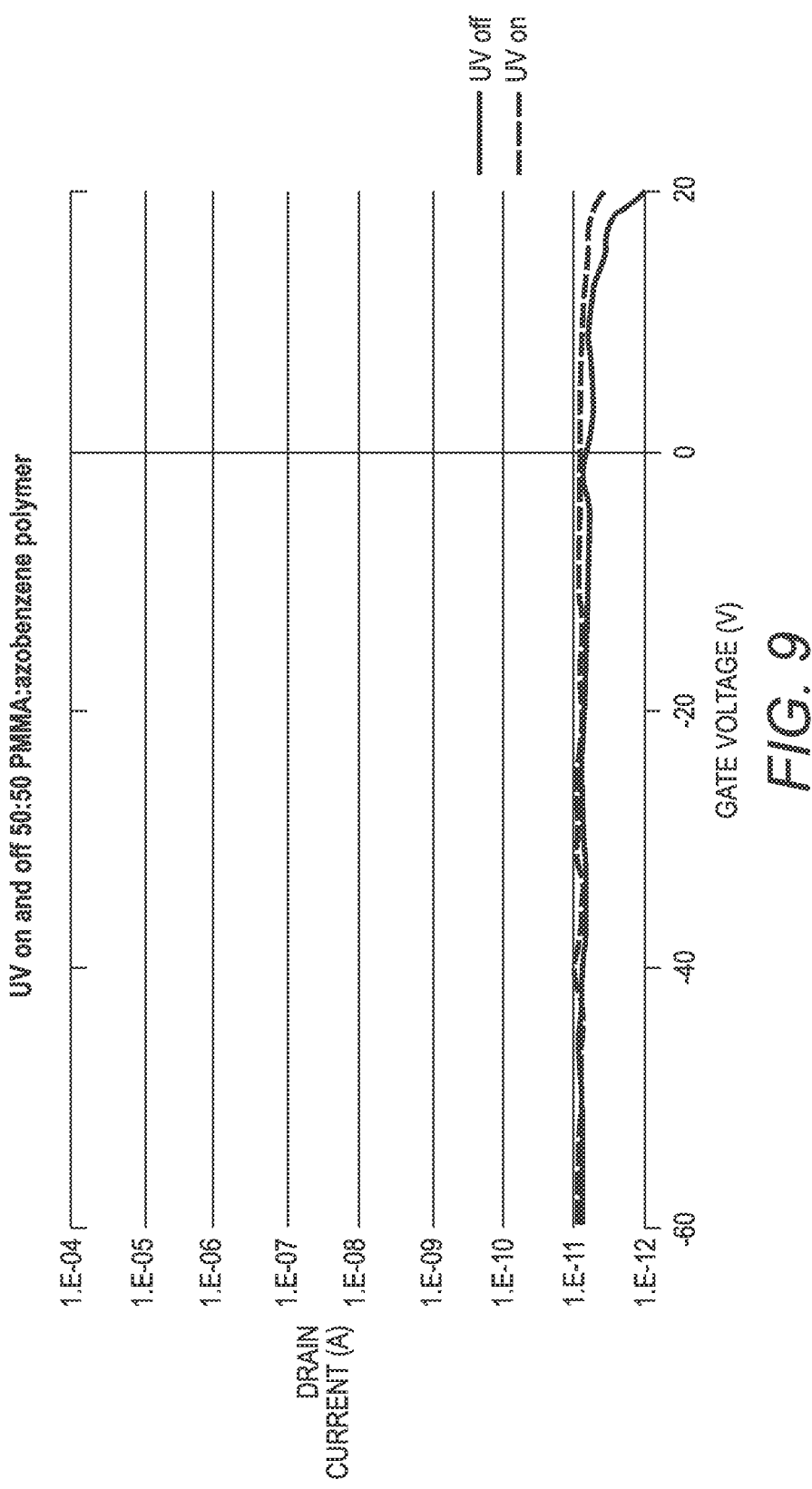
FIG. 9 is a current versus voltage graph for a control containing a polymer and a photo-responsive compound, showing two curves (with and without UV illumination).
Figure 10:
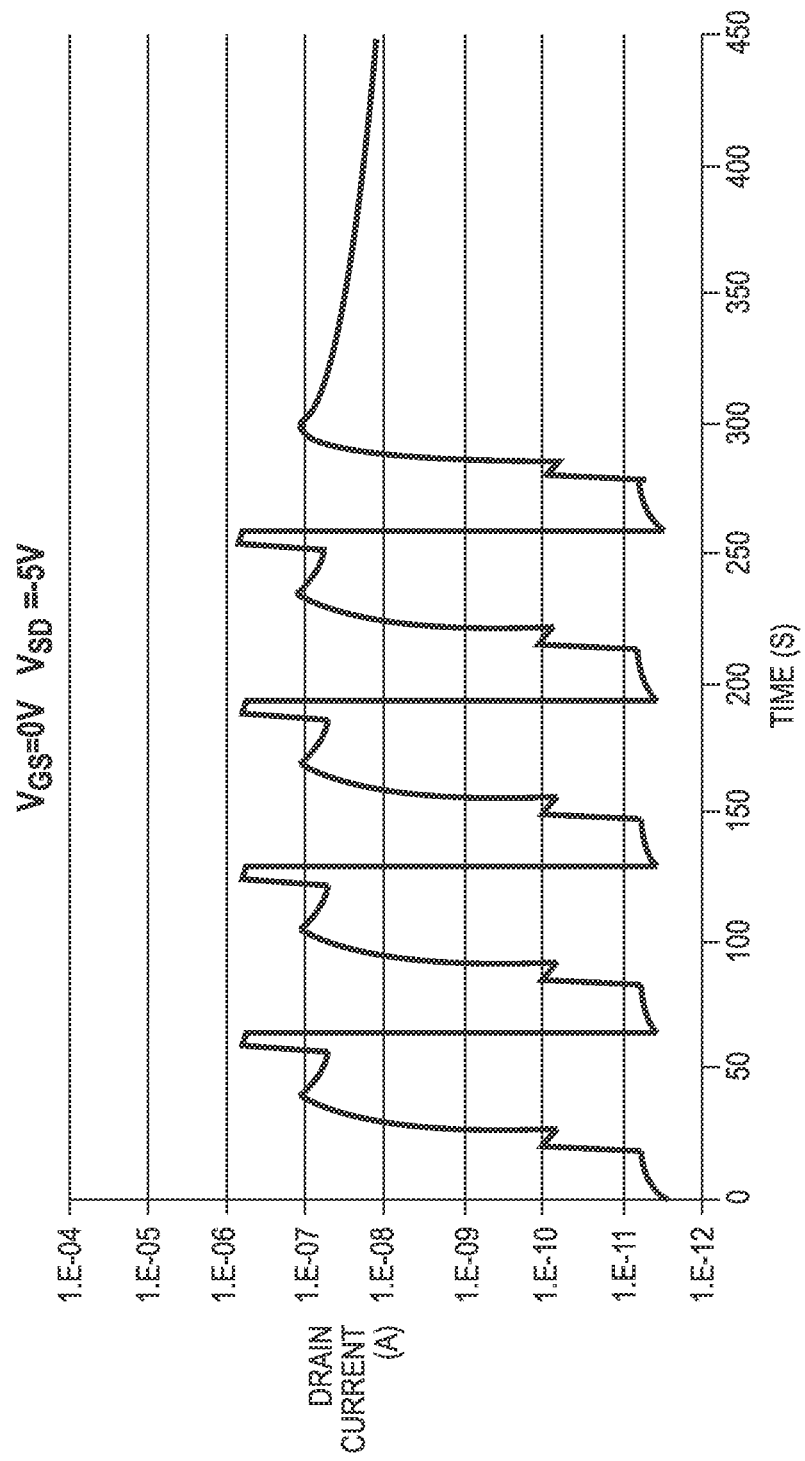
FIG. 10 is a current versus time graph showing "write" and "erase" at s/d voltage of −5 V and gate bias of 0 V.
Figure 11:
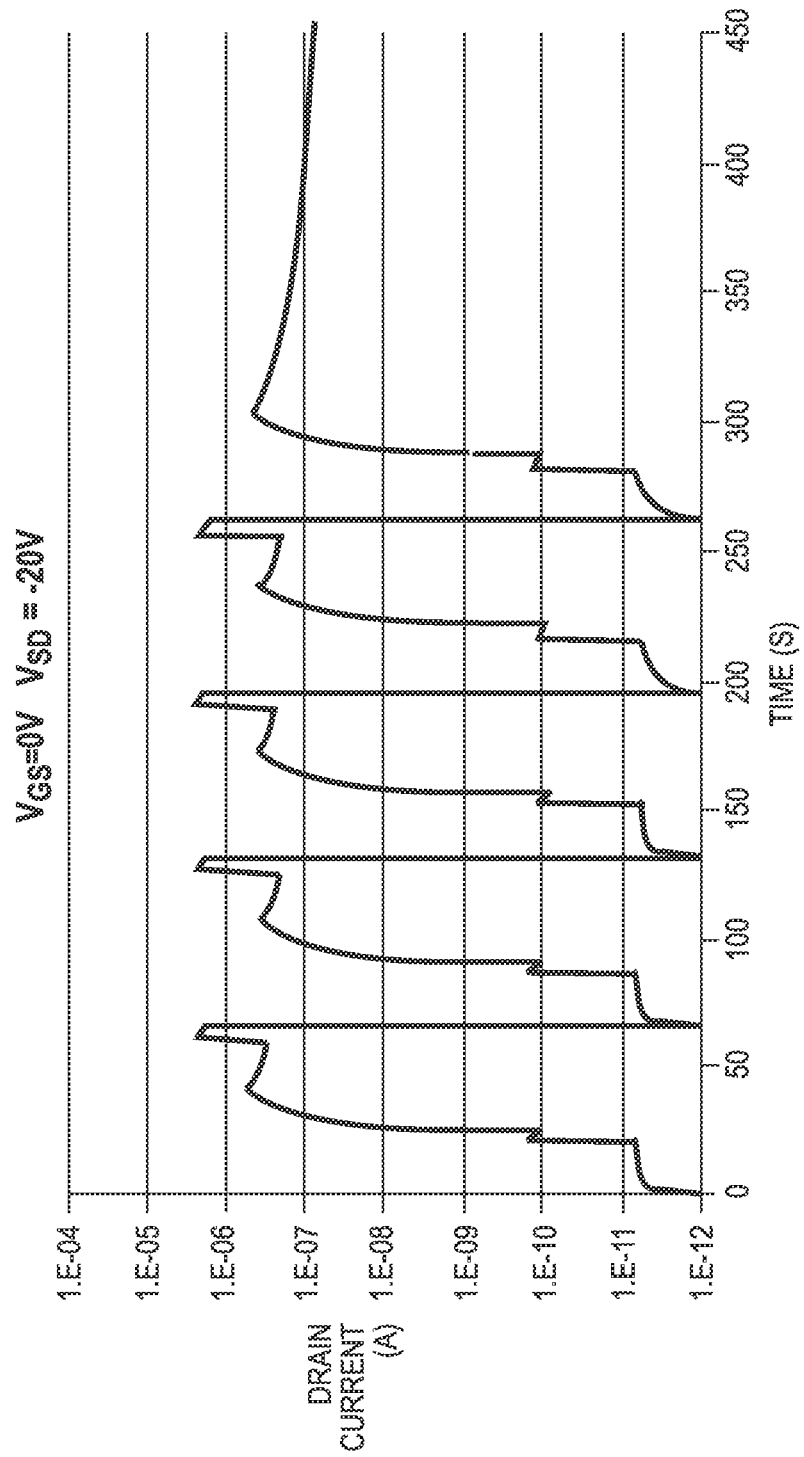
FIG. 11 is a current versus time graph showing "write" and "erase" at s/d voltage of −20 V and gate bias of 0 V.
Figure 12:
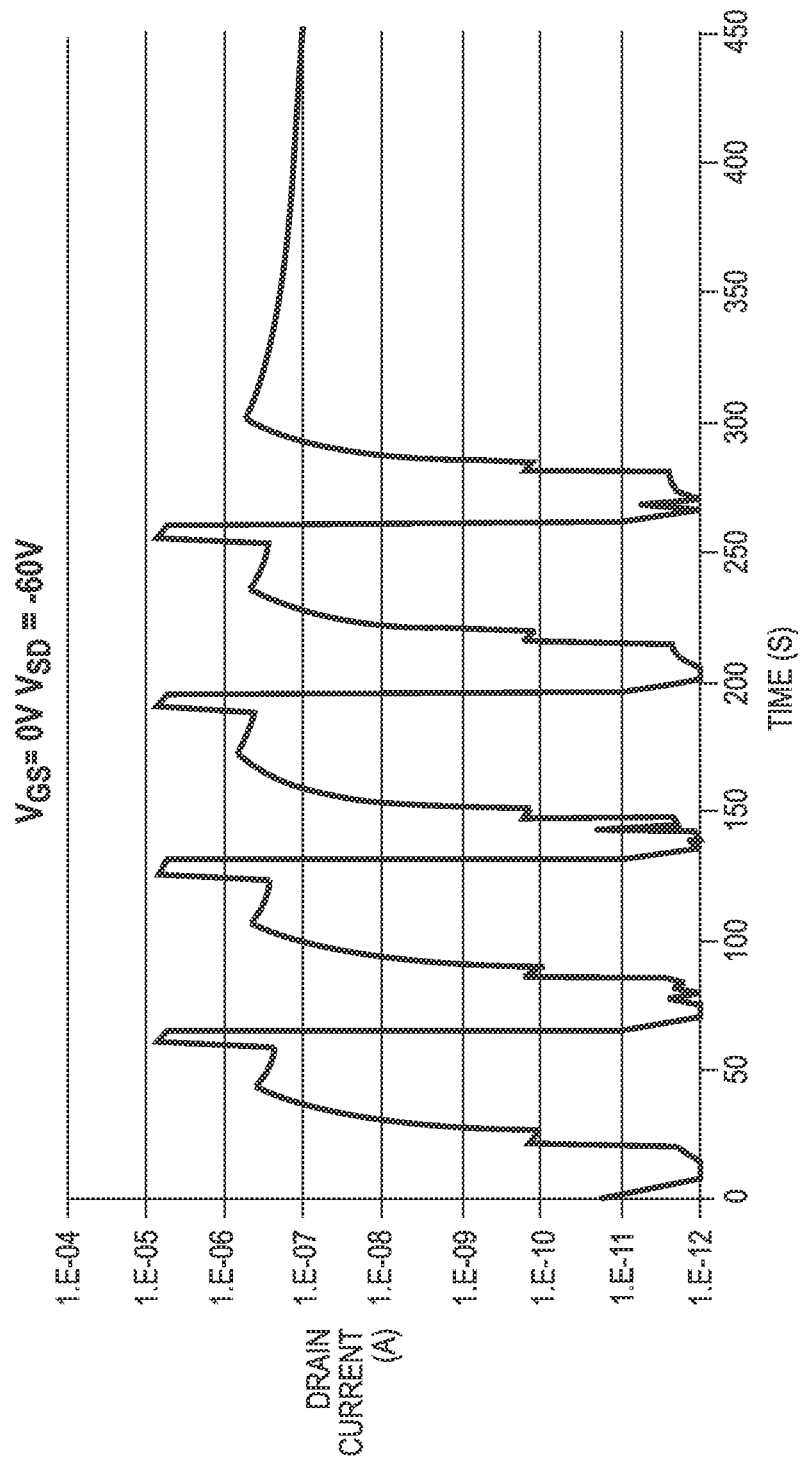
FIG. 12 is a current versus time graph showing "write" and "erase" at s/d voltage of −60 V and gate bias of 0 V.
Figure 13:
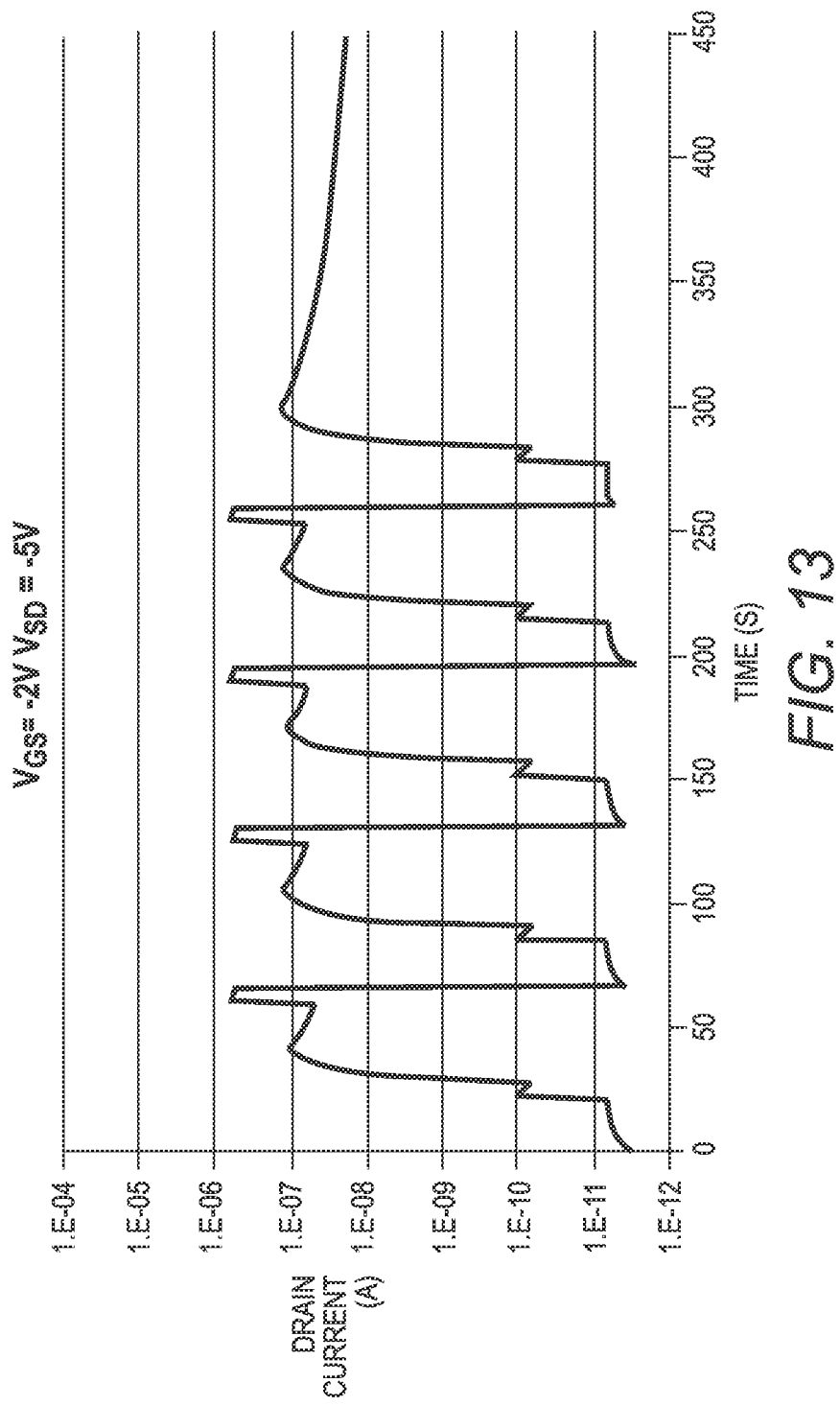
FIG. 13 is a current versus time graph showing "write" and "erase" at s/d voltage of −5 V and gate bias of −2 V.
Figure 14:
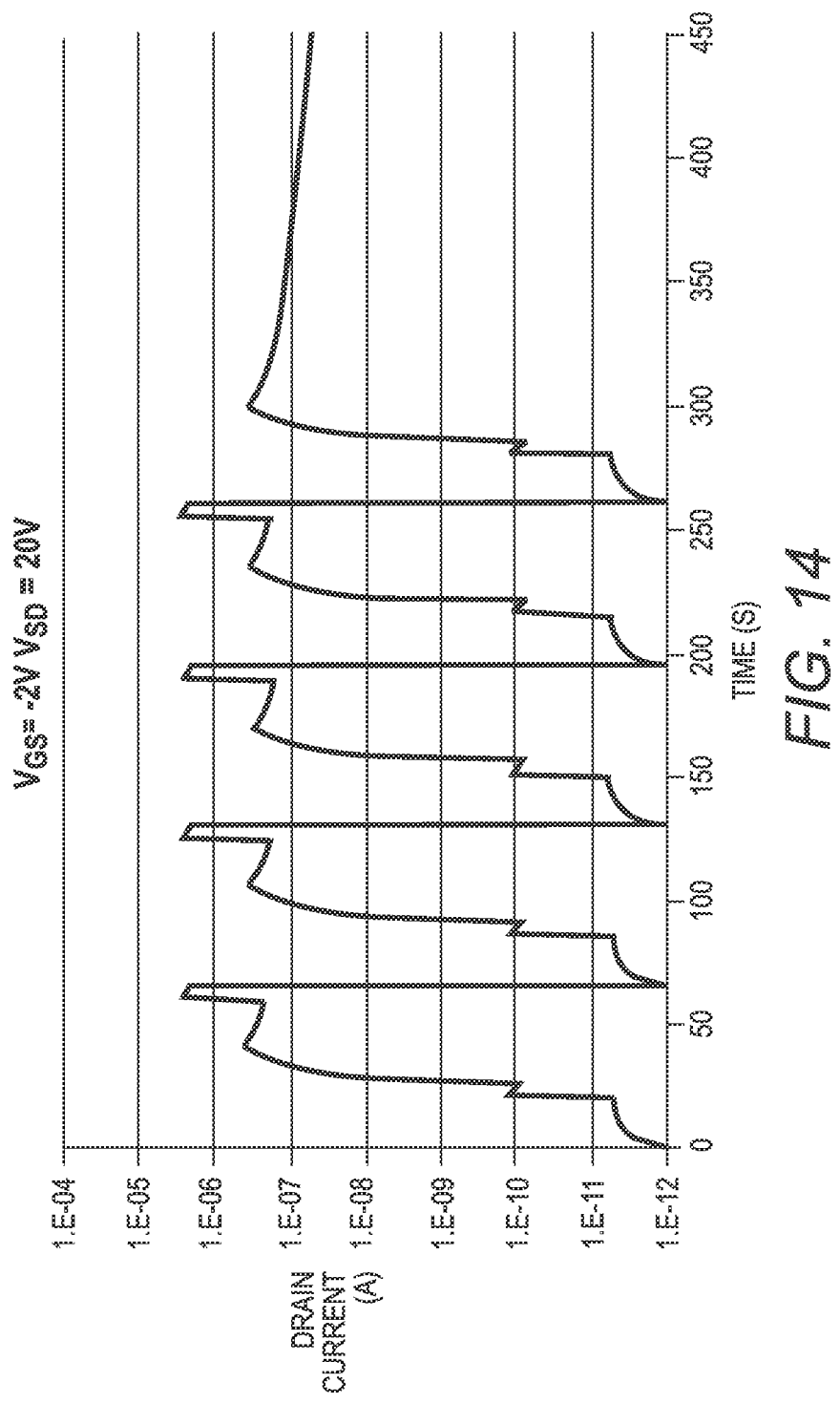
FIG. 14 is a current versus time graph showing "write" and "erase" at s/d voltage of −20 V and gate bias of −2 V.
Figure 15:
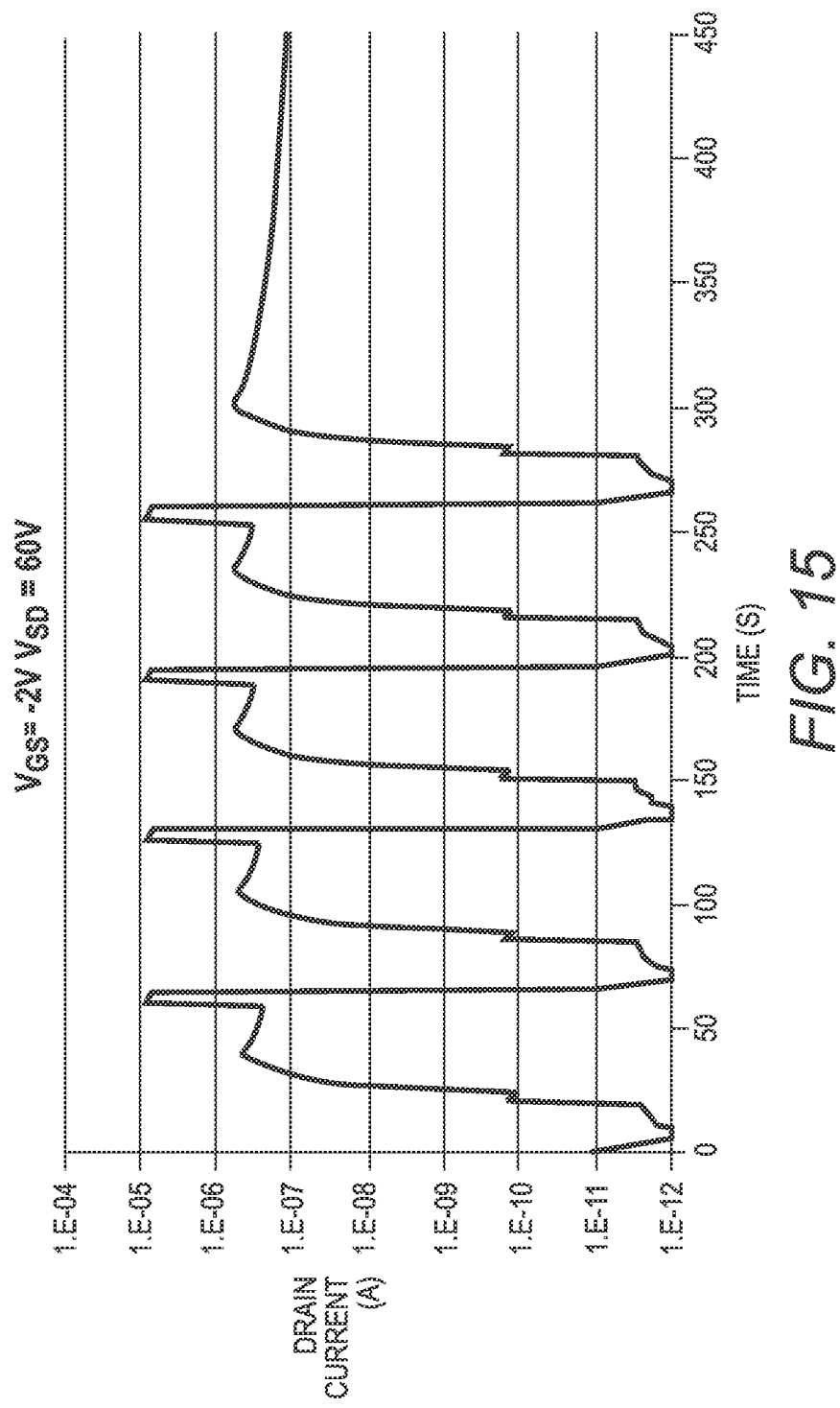
FIG. 15 is a current versus time graph showing "write" and "erase" at s/d voltage of −60 V and gate bias of −2 V.
Figure 16:
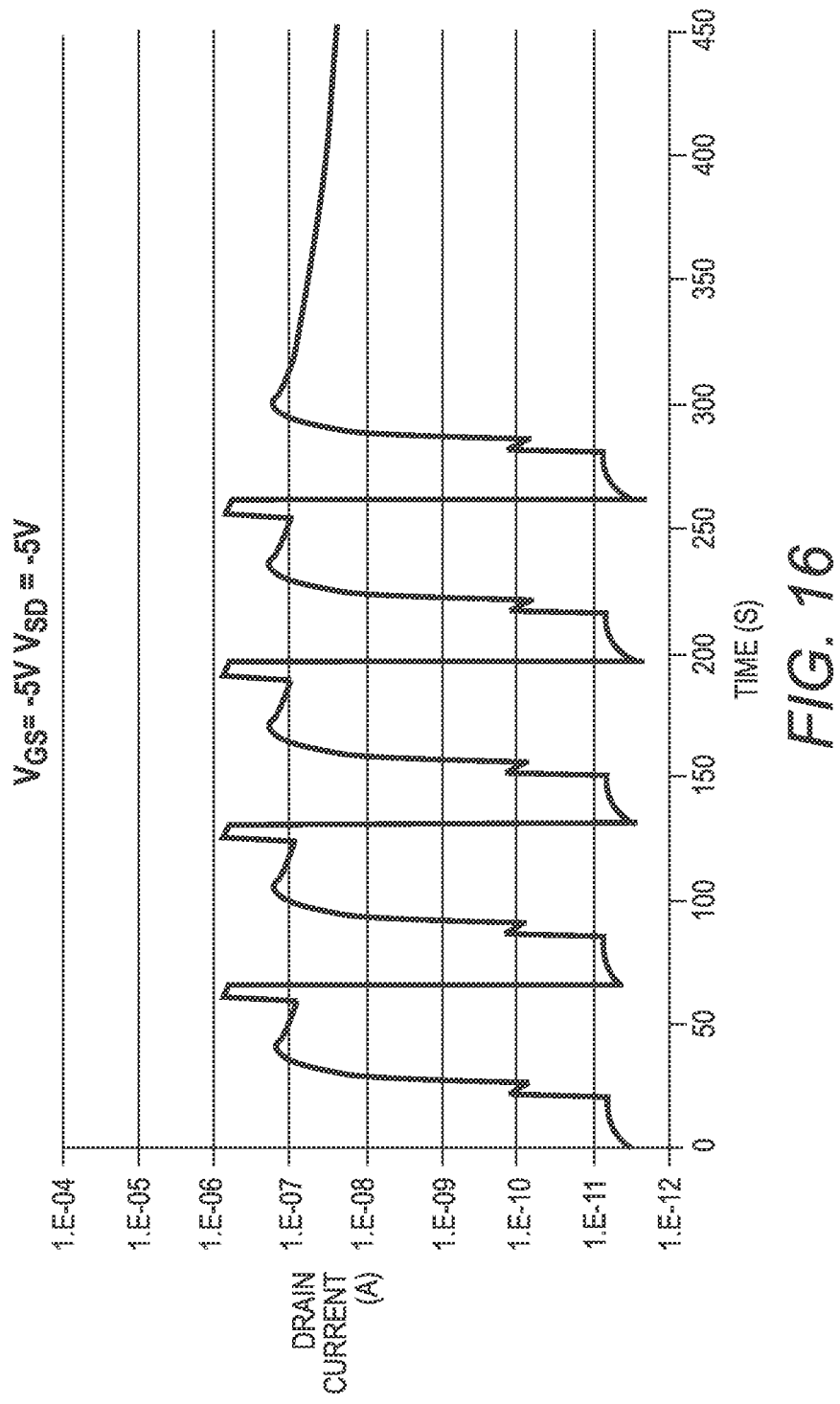
FIG. 16 is a current versus time graph showing "write" and "erase" at s/d voltage of −5 V and gate bias of −5 V.
Figure 17:
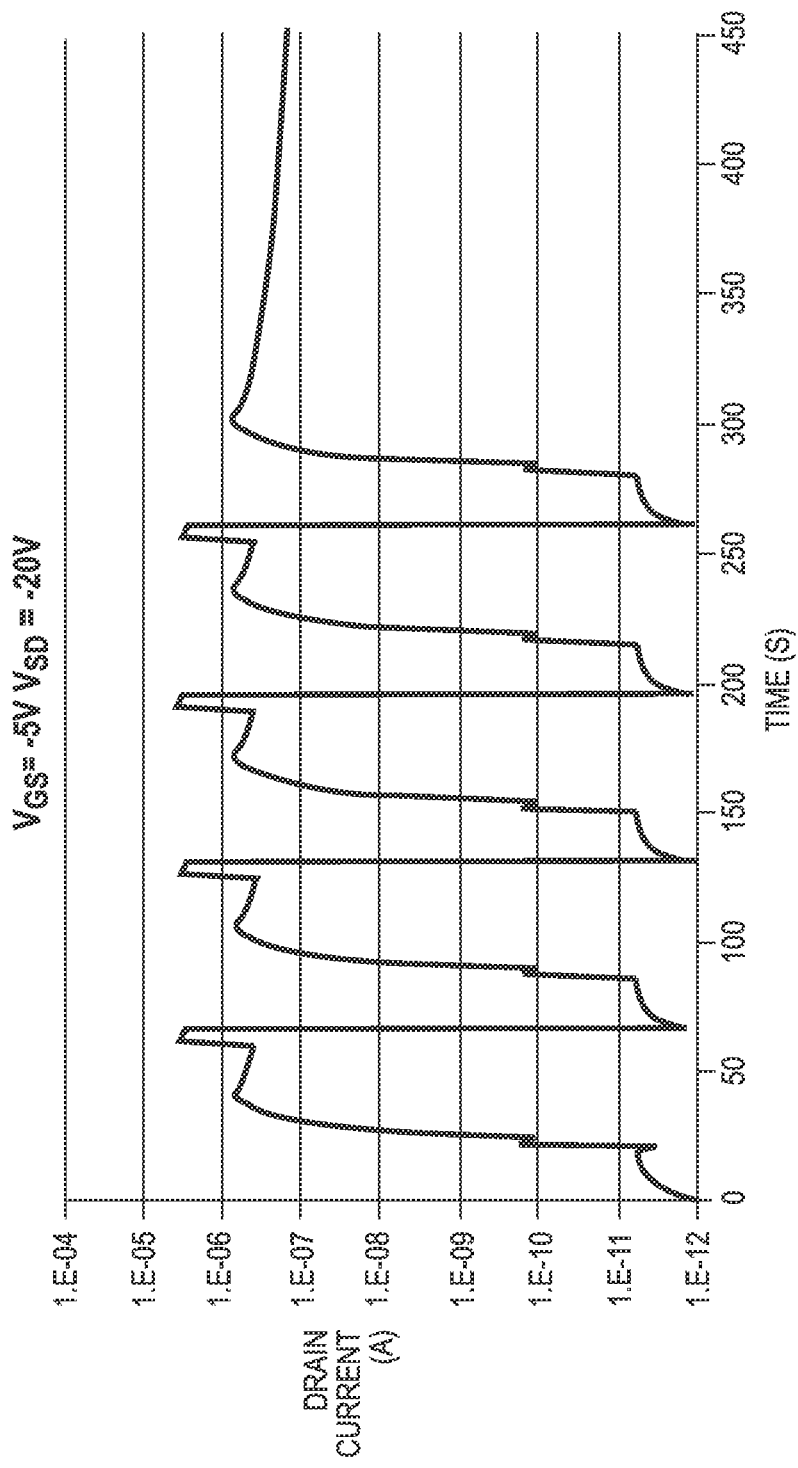
FIG. 17 is a current versus time graph showing "write" and "erase" at s/d voltage of −20 V and gate bias of −5 V.
Figure 18:
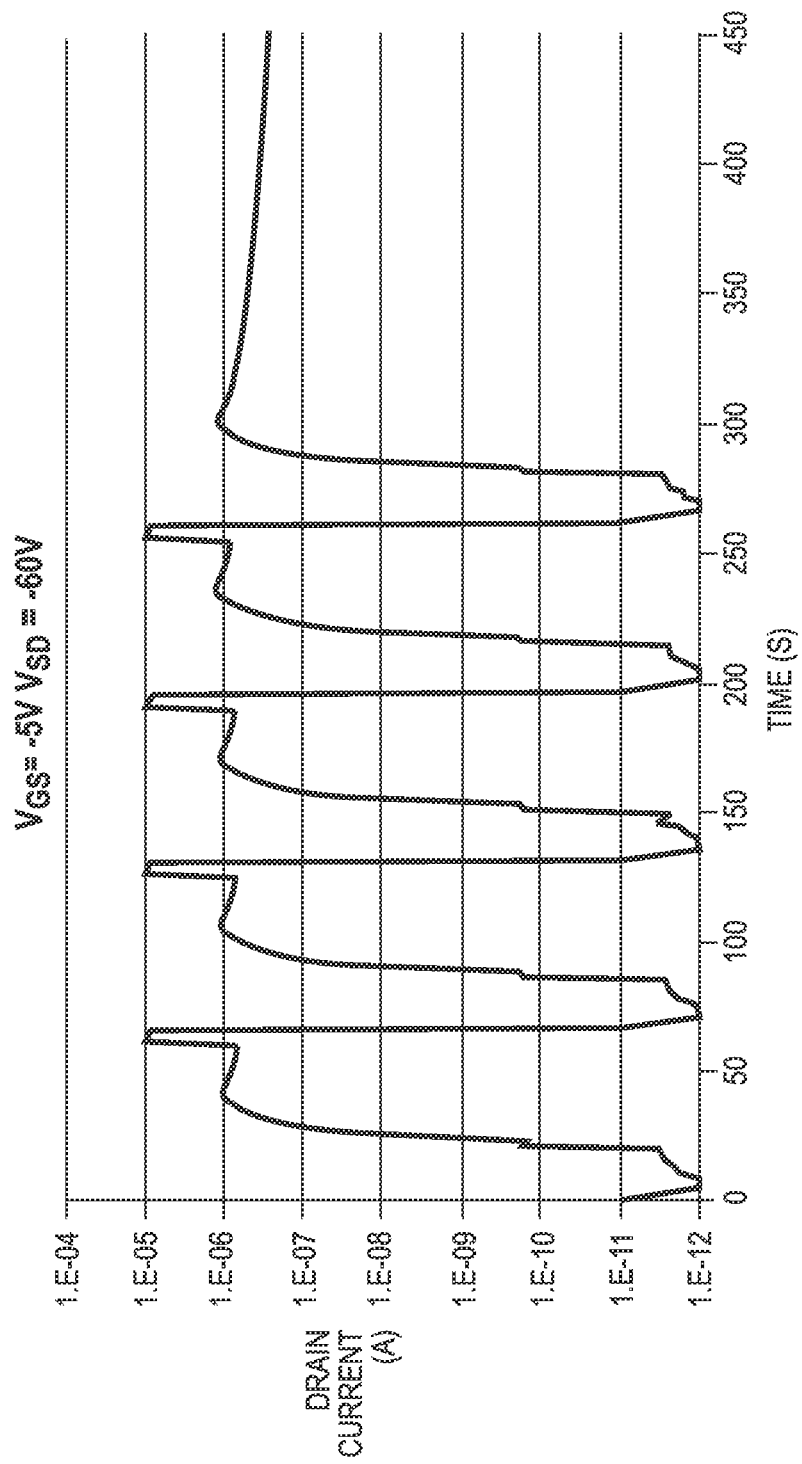
FIG. 18 is a current versus time graph showing "write" and "erase" at s/d voltage of −60 V and gate bias of −5 V.

The last control experiment was using the polymer of Formula (a) with PMMA in a 1:1 weight ratio, without dipentyl-BTBT. The result is shown in FIG. 9. There was no current modulation depending on UV irradiation. This indicated that the organic semiconductor compound was required to obtain the memory effect.

Additional Testing

The memory device of Example 1 was operated at various conditions such as source/drain voltage from about −5 to about −60V, and gate bias from about 0 to about −5 V. In this regard, the source/drain voltage is measured between the source and drain electrodes, and the gate bias voltage is measured between the source and gate electrodes. The I-V curves for different combinations of these conditions are shown in FIGS. 10-18. In all cases, high current on/off ratio and very reproducible on/off behavior could be achieved, indicating very robust operating conditions.

Example 2

Based on the results shown in FIG. 8, additional tests were performed with a combination of Disperse Red 1, PMMA, and dipentyl-BTBT in a weight ratio of 5:45:50. Disperse Red 1 is illustrated below:

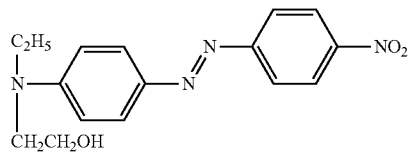

Disperse Red 1

Figure 19:
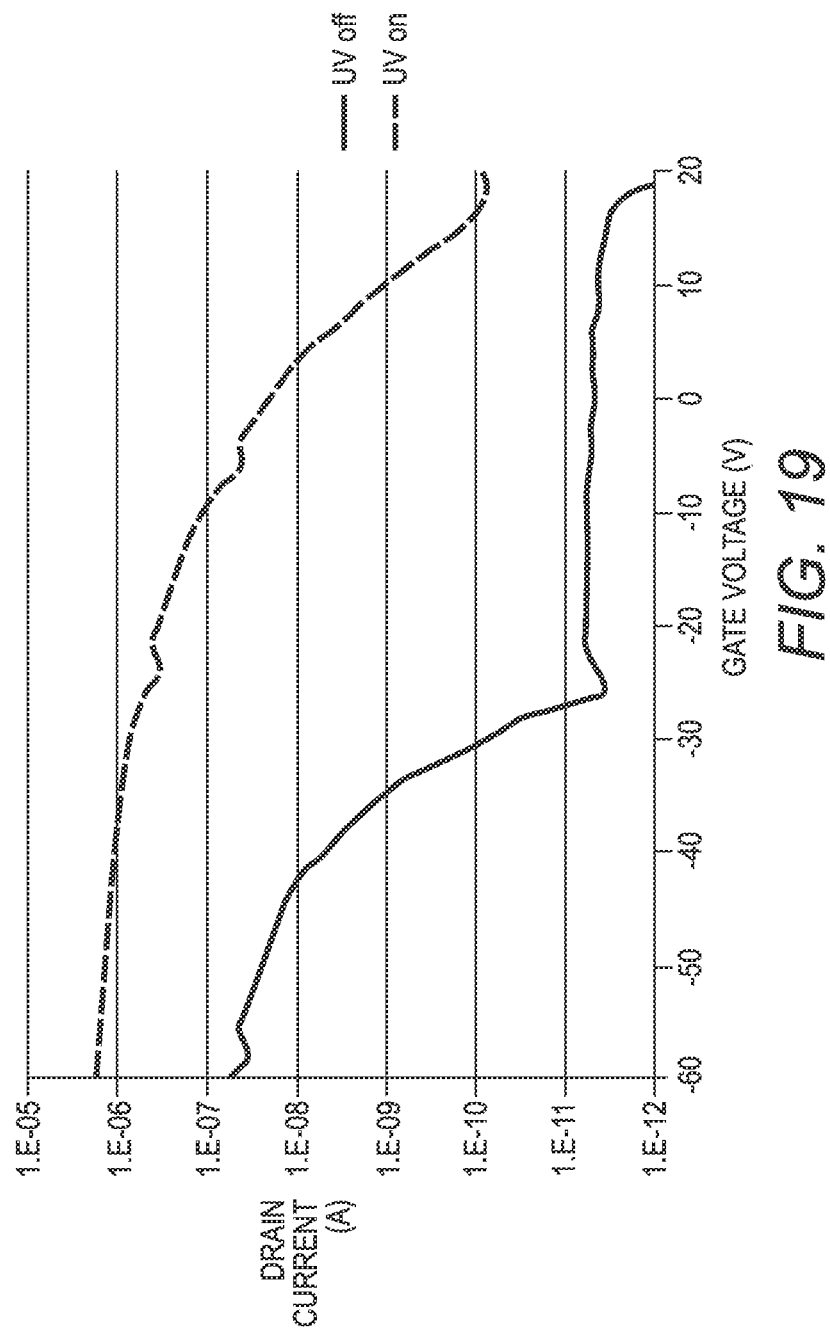
FIG. 19 is a current versus voltage graph for a device of the present disclosure including an organic semiconductor compound and a photo-responsive compound in a 10:1 weight ratio, along with a non-photo-responsive polymer binder, showing two curves (with and without UV illumination). The two curves are very different.

The device was operated by applying a drain voltage of −60 V and sweeping the gate voltage from +20 V to −60 V, with UV on and UV off. The results are shown in FIG. 19, and are comparable to those exhibited in FIG. 5. Therefore, the device should be able to switch between an "on" and an "off" state at low or no gate bias (indicated by the arrows) by irradiating with UV light to "write", and applying a large gate bias to "erase" the bi-stable states.

Figure 20:
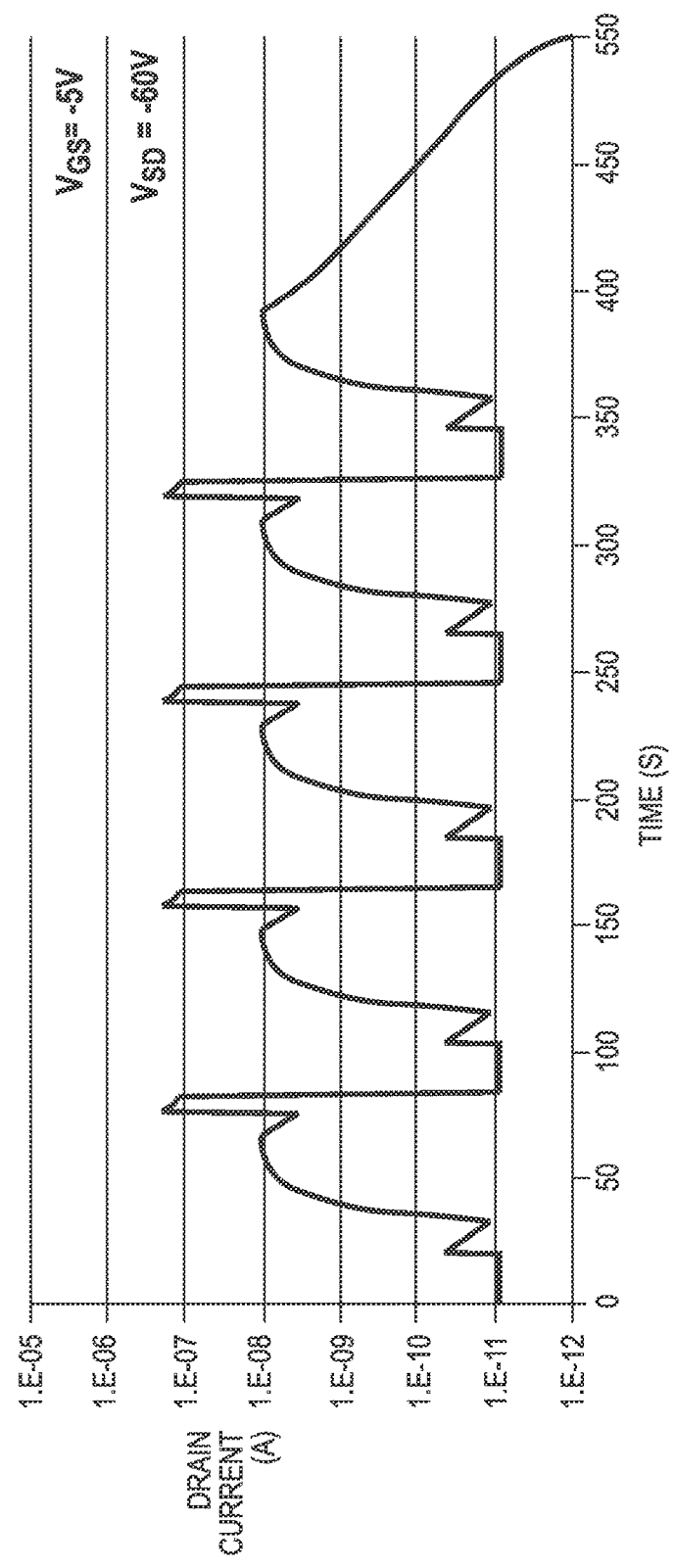
FIG. 20 is a current versus time graph showing "write" and "erase" at s/d voltage of −60 V and gate bias of −5 V for the device of FIG. 19.

The device was then operated with a source/drain voltage of −60 V and a gate bias of −5 V. The I-V curve is shown in FIG. 20, and indicates both high on/off current ratio and reproducibility.

Figure 21:
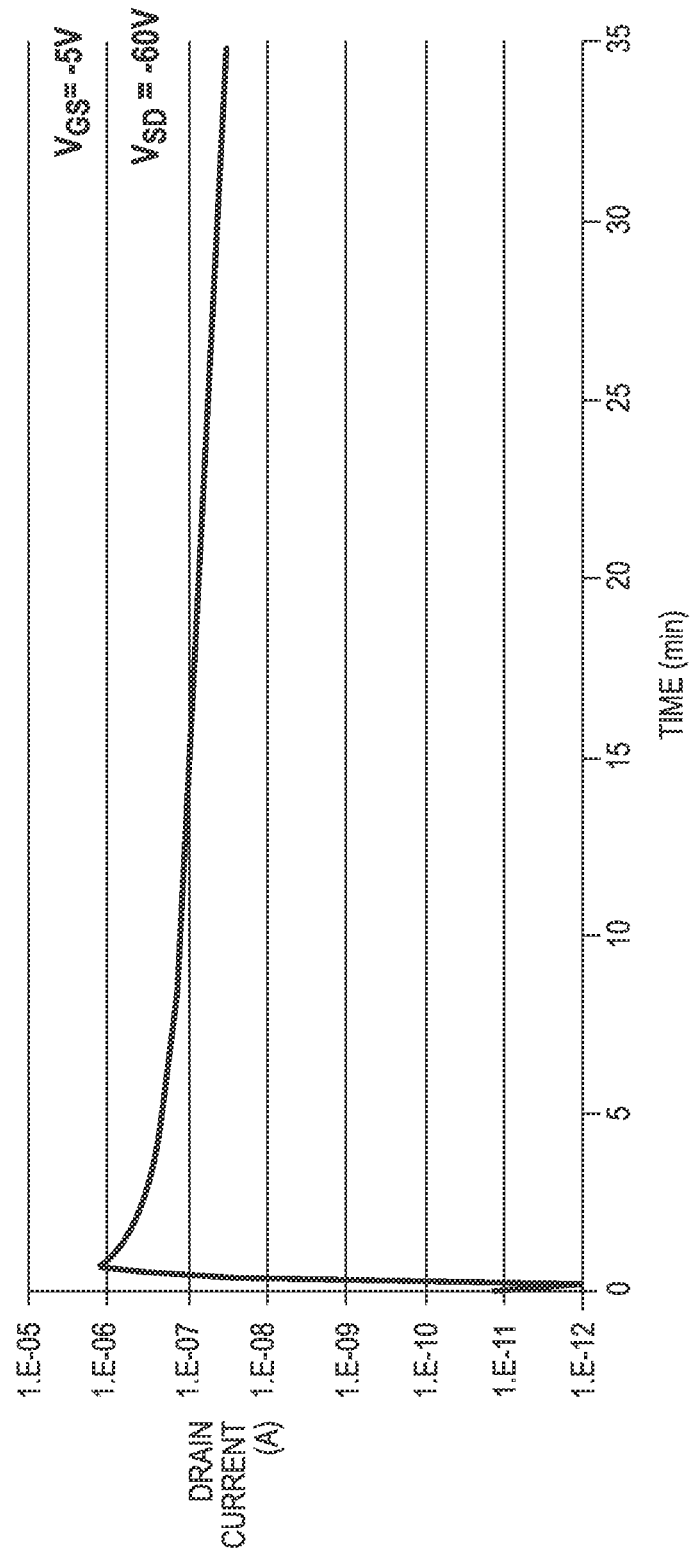
FIG. 21 is a current versus time graph for the device of FIG. 5.
Figure 22:
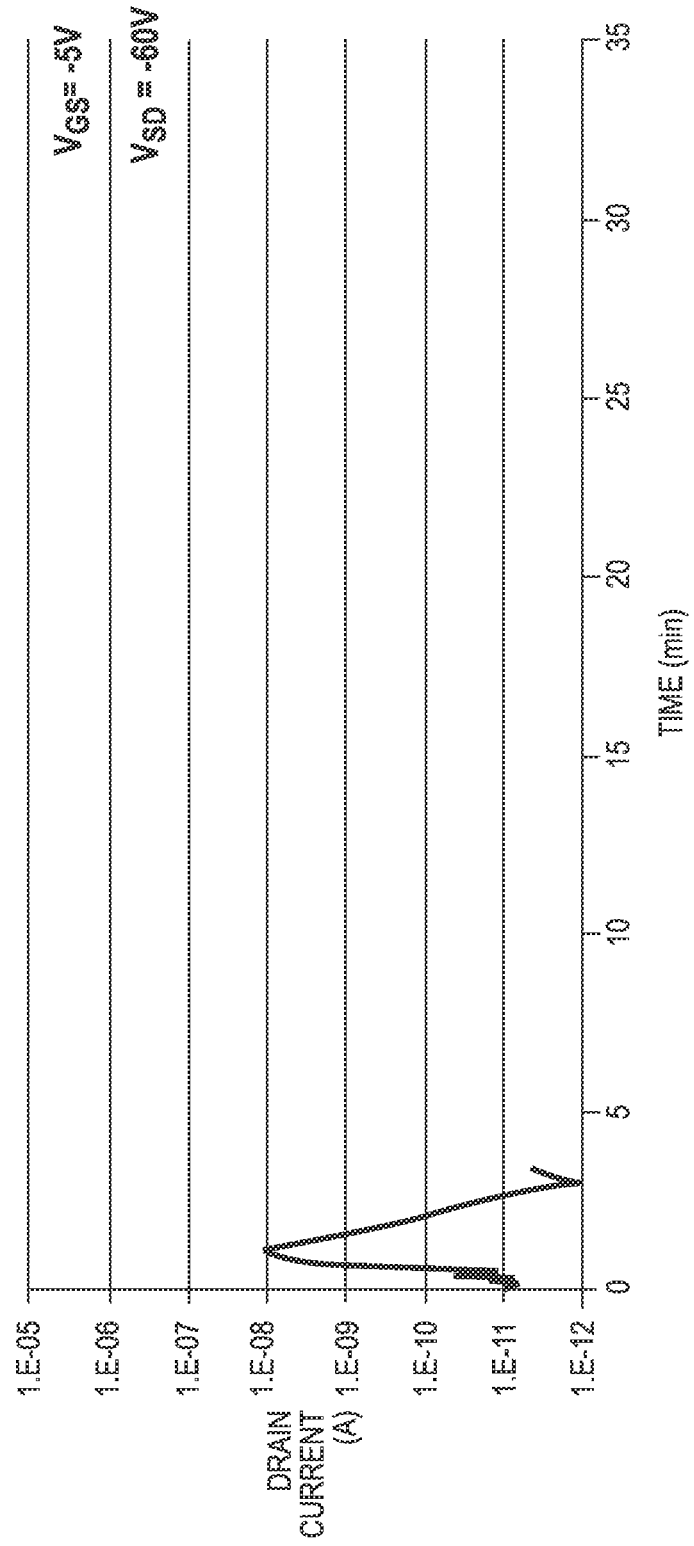
FIG. 22 is a current versus time graph for the device of FIG. 19.

FIG. 21 is a graph of current versus time for a semiconducting layer containing a 50:50 weight ratio of dipentyl-BTBT and the polymer of Formula (a), with a performance corresponding to FIG. 5. FIG. 22 is a graph of current versus time for a semiconducting layer containing Disperse Red 1, PMMA, and dipentyl-BTBT in a weight ratio of 5:45:50. Both devices were operated with a source/drain voltage of −60 V and a gate bias of −5 V.

FIG. 21 shows that the system of a semiconducting compound and a photo-responsive polymer has a long retention time, with a slow decay of the current over a long period of over 30 minutes. This long retention is desirable for memory applications. On the other hand, the system containing a semiconducting compound and a photo-responsive compound showed a very short retention time, as seen by the current decaying rapidly to its original state in FIG. 22. This system could be used for a DRAM type of application. Alternatively, this system could be used as an optical sensor device rather than a memory device.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

The invention claimed is:
1. An electronic device, comprising:
a substrate;
a first electrode and a second electrode contacting a semiconducting layer, wherein the semiconducting layer comprises an organic semiconductor and a photo-responsive polymer, wherein the photo-responsive polymer forms a matrix within which the organic semiconductor is dispersed; and
a dielectric layer separating a third electrode from the semiconducting layer, the first electrode, and the second electrode;
wherein the photo-responsive polymer includes a monomer of Formula (G-1):

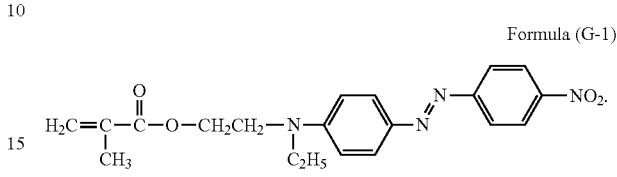

Formula (G-1)

2. The electronic device of claim 1, wherein the organic semiconductor is an organic semiconducting compound or a semiconducting polymer.

3. The electronic device of claim 1, wherein the organic semiconductor is a compound having the structure of Formula (I):

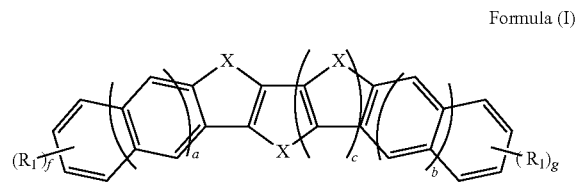

Formula (I)

wherein each $R_1$ is independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, and halogen; f and g are the number of $R_1$ sidechains on their respective phenyl or naphthyl ring, and are independently an integer from 0 to 6; X is selected from the group consisting of O, S, and Se; and a, b, and c are independently 0 or 1.

4. The electronic device of claim 3, wherein the organic semiconductor has the structure of Formula (II):

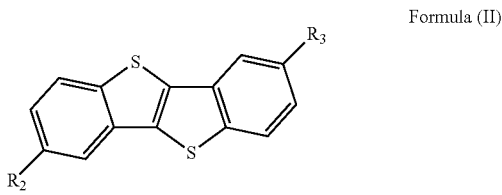

Formula (II)

wherein $R_2$ and $R_3$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, and halogen.

5. The electronic device of claim 4, wherein the organic semiconductor has the structure of Formula (II-a):

Formula (II-a)

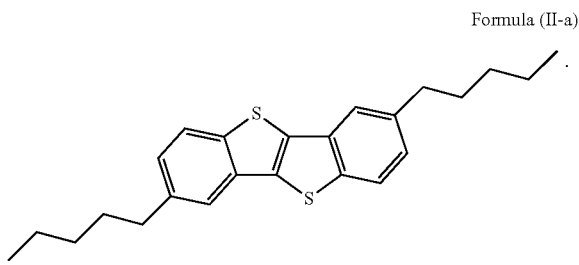 [SMILES: CCCCCc1ccc2sc3c4cc(CCCCC)ccc4sc3c2c1]

6. The electronic device of claim 3, wherein the organic semiconductor has the structure of Formula (III):

Formula (III)

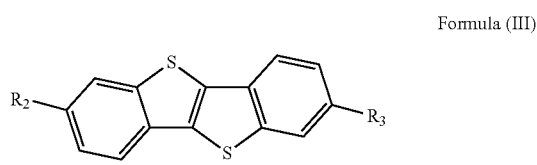

wherein $R_2$ and $R_3$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, and halogen.

7. The electronic device of claim 3, wherein the organic semiconductor has the structure of Formula (IV):

Formula (IV)

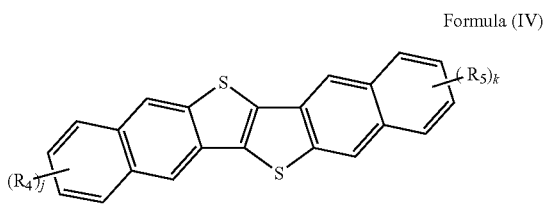

wherein each $R_4$ and $R_5$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, and halogen; and j and k are independently an integer from 0 to 6.

8. The electronic device of claim 3, wherein the organic semiconductor has the structure of Formula (V):

Formula (V)

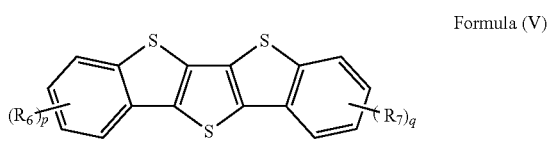

wherein each $R_6$ and $R_7$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, and halogen; and j and k are independently an integer from 0 to 4.

9. The electronic device of claim 3, wherein the organic semiconductor has the structure of Formula (VI):

Formula (VI)

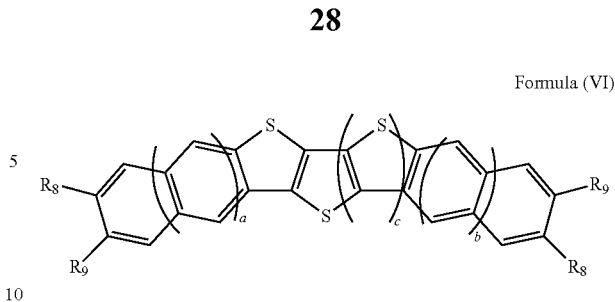

wherein $R_8$ and $R_9$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, and halogen.

10. The electronic device of claim 1, wherein the organic semiconductor has the structure of Formula (VII):

Formula (VII)

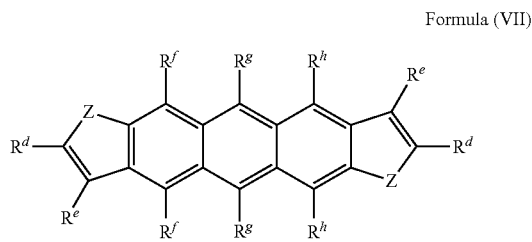

wherein $R^d$ through $R^h$ are independently selected from alkyl, substituted alkyl, alkenyl, substituted alkenyl, alkynyl, substituted alkynyl, trialkylsilylalkynyl, aryl, substituted aryl, heteroaryl, substituted heteroaryl, alkoxy, alkylthio, trialkylsilyl, aldehyde, cyano, and halogen; and Z is selected from the group consisting of O, S, Se, and —CH=CH—.

11. The electronic device of claim 10, wherein the organic semiconductor has the structure of Formula (VIII):

Formula (VIII)

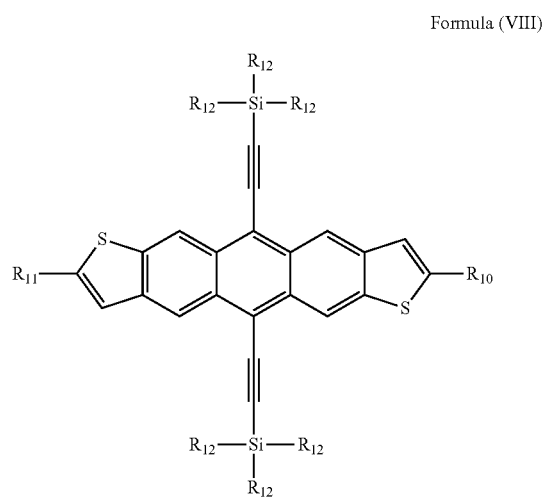

wherein $R_{10}$ and $R_{11}$ are independently selected from alkyl, substituted alkyl, alkenyl, substituted alkenyl, alkynyl, substituted alkynyl, aryl, substituted aryl, heteroaryl, substituted heteroaryl, alkoxy, alkylthio, trialkylsilyl, aldehyde, cyano, and halogen; and
wherein $R_{12}$ is alkyl or substituted alkyl.

12. The electronic device of claim 11, wherein the organic semiconductor has the structure of Formula (VIII-a) or (VIII-b):

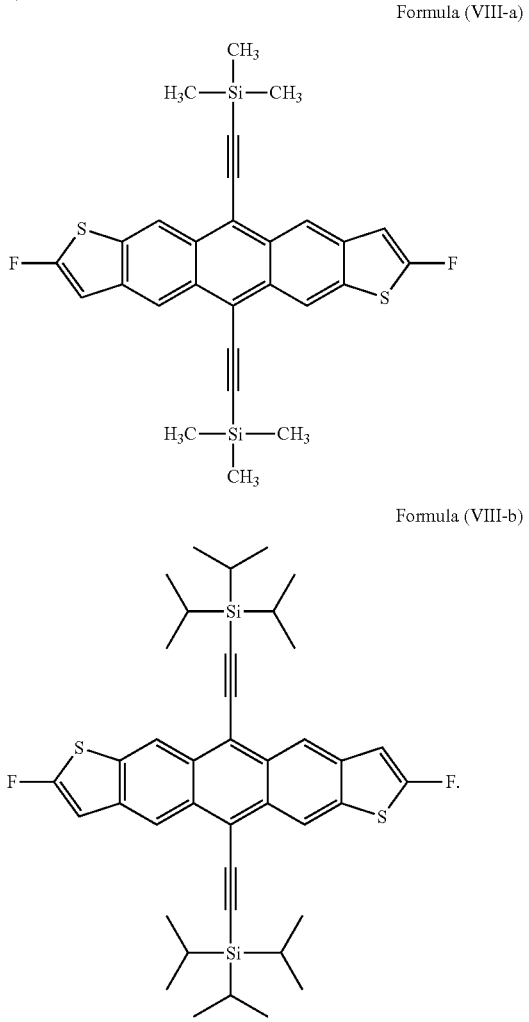

Formula (VIII-a)

Formula (VIII-b)

13. The electronic device of claim 10, wherein the organic semiconductor has the structure of Formula (IX):

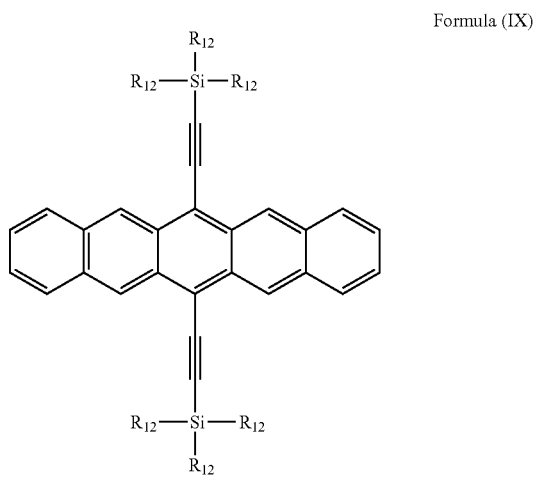

Formula (IX)

wherein $R_{12}$ is alkyl or substituted alkyl.

14. The electronic device of claim 1, wherein the photo-responsive polymer is a copolymer.

15. The electronic device of claim 14, wherein the monomer of Formula (G-1) is from about 1 mole % to about 50 mole % of the copolymer.

16. The electronic device of claim 1, wherein the photo-responsive polymer has the structure of Formula (a):

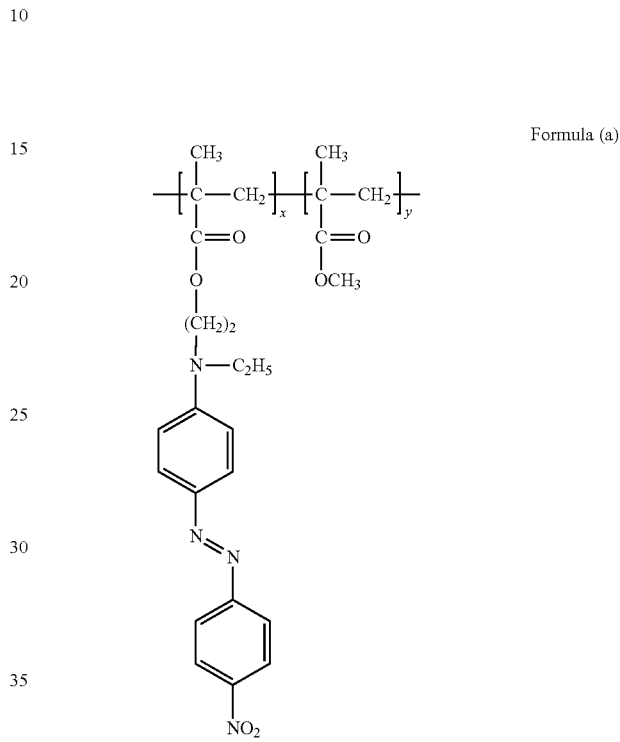

Formula (a)

wherein x and y are the mole ratio for the respective monomer, and are between 0 and 1.

17. The electronic device of claim 1, wherein the weight ratio of the organic semiconductor to the photo-responsive polymer is from about 25:75 to about 95:5.

18. The electronic device of claim 1, wherein the organic semiconductor has a band gap of from about 1.2 to about 3.5 eV.

19. The electronic device of claim 1, wherein the device is a memory device that further comprises a light source adapted to illuminate the semiconducting layer.

20. The memory device of claim 19, wherein the substrate is transparent and the light source illuminates the semiconducting layer through the substrate.

21. The electronic device of claim 1, wherein the difference between the HOMO level of the organic semiconductor and the HOMO level of the photo-responsive polymer is not greater than 0.5 eV.

22. A semiconductor composition comprising:
an organic semiconductor;
a photo-responsive polymer having the structure of Formula (a):

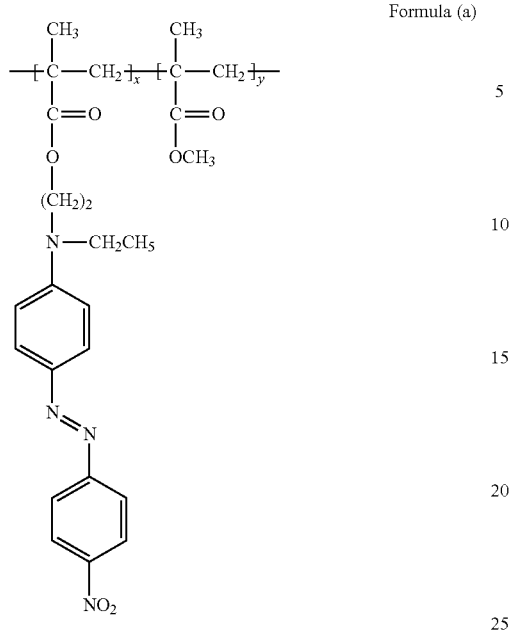
Formula (a)
wherein x and y are the mole ratio for the respective monomer, and are between 0 and 1; and
a non-photo-responsive polymer.
* * * * *